United States Patent
Ishikura et al.

(10) Patent No.: US 6,922,354 B2
(45) Date of Patent: Jul. 26, 2005

(54) SEMICONDUCTOR MEMORY DEVICE

(75) Inventors: Satoshi Ishikura, Takatsuki (JP); Katsuji Satomi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/808,402

(22) Filed: Mar. 25, 2004

(65) Prior Publication Data

US 2004/0196705 A1 Oct. 7, 2004

(30) Foreign Application Priority Data

Apr. 4, 2003 (JP) ........................................ 2003-101196

(51) Int. Cl.[7] .............................................. H11C 11/00
(52) U.S. Cl. ........................ 365/154; 257/369; 257/903
(58) Field of Search ................................ 365/154, 156; 257/903, 904, 369

(56) References Cited

U.S. PATENT DOCUMENTS

| | | | |
|---|---|---|---|
| 5,930,163 A | 7/1999 | Hara et al. | |
| 6,417,549 B1 | 7/2002 | Oh | |
| 6,479,860 B2 * | 11/2002 | Ohbayashi | 257/315 |
| 6,597,041 B2 * | 7/2003 | Ohbayashi | 257/369 |
| 6,677,649 B2 * | 1/2004 | Osada et al. | 257/379 |
| 6,750,555 B2 * | 6/2004 | Satomi et al. | 257/E27.098 |

FOREIGN PATENT DOCUMENTS

JP          10178110         6/1998

* cited by examiner

*Primary Examiner*—Gene N. Auduong
(74) *Attorney, Agent, or Firm*—Stevens, Davis, Miller & Mosher, LLP

(57) ABSTRACT

Positive/negative bit lines are arranged on a second-layer interconnection the VDD power supply interconnection is arranged between the positive/negative bit lines, the word line is arranged on a third-layer interconnection, and the VSS power supply interconnection is arranged on a fourth-layer interconnection. Alternatively, the word line is arranged on the second-layer interconnection, the positive/negative bit lines are arranged on the third-layer interconnection, the VDD power supply interconnection is arranged between the positive/negative bit lines, and the VSS power supply interconnection is arranged on the fourth-layer interconnection. Alternatively, the VDD power supply interconnection is arranged on the second-layer interconnection, the positive/negative bit lines are arranged on the third-layer interconnection, the word line is arranged on the fourth-layer interconnection, and the VSS power supply interconnection is arranged on the fifth-layer interconnection.

46 Claims, 28 Drawing Sheets

407  409  408

SEMICONDUCTOR MEMORY DEVICE

BACKGROUND OF THE INVENTION

1. Field of the Invention

The present invention relates to a layout design technology of a semiconductor integrated circuit, and a semiconductor memory device of a CMOS SRAM (Static Random Access Memory, hereinafter referred to as "CMOS SRAM").

2. Description of the Prior Art

With a rapid progress in a microfabrication of a semiconductor, a processing dimension of nearly 100 nm has begun to be achieved in recent years, while a lithography technology has increasingly become a bottleneck for the progress in microfabrication. Taking these situations into account, there has begun to be used a horizontal memory cell layout which is easy to be lithographically processed instead of a vertical memory cell layout which has been mainly used formerly as a layout structure of an SRAM memory cell.

There is schematically shown a layout example of a lower layer section of a vertical memory cell of a conventional CMOS SRAM in FIG. 20. In FIG. 20, reference numeral 100 represents a P-well; 101, an N-well; 102, a boundary line between the wells; 103, a diffusion layer of a source or a drain (when on P-well 100, N type diffusion layer; on N-well 101, P type diffusion layer); 104, a gate electrode; 105, a contact hole of connecting the diffusion layer 103 or the gate electrode 104 to a first-layer metal interconnection (not shown); 107, an N-channel access transistor; 108, an N-channel drive transistor; 109, a P-channel load transistor; and 110, a cell boundary frame for 1 bit of the memory cell.

There is schematically shown a layout example of a lower layer section of a horizontal memory cell of a conventional CMOS SRAM in FIG. 21. In FIG. 21, the same reference numerals are given to portions corresponding or similar to those of FIG. 20; and reference numeral 106 represents a shared contact of connecting the diffusion layer 103 to the gate electrode 104 with the first-layer metal interconnection (not shown) by one contact hole. Both of FIG. 20 and FIG. 21 show a six-transistor type SRAM memory cell comprising a pair of the N-channel access transistors 107, a pair of the N-channel drive transistors 108, and a pair of the P-channel load transistors 109; and a circuit diagram of such a memory cell is shown by FIG. 28. In the case of the horizontal memory cell shown in FIG. 21, the boundary line 102 between the wells is extended in a vertical direction in FIG. 21.

This horizontal memory cell is generally arranged in flip as shown in FIG. 22. In FIG. 22, reference numeral 221 represents a memory cell array, and reference numeral 222 represents a horizontal memory cell.

Interconnection layouts of the horizontal memory cell are also shown in FIGS. 23 to 25. Layouts of the first-layer metal interconnection, the second-layer metal interconnection, and the third-layer metal interconnection are shown in FIG. 23, FIG. 24, and FIG. 25, respectively; and in FIG. 23, reference numeral 111 represents a first-layer interconnection. In FIG. 24, reference numerals 112, and 113 represent a second-layer interconnection, and a via hole section (connecting section by via hole) of connecting the first-layer interconnection 111 to the second-layer interconnection 112, respectively. Further, reference numeral 114 represents a positive bit line (BL in FIG. 28); 115, a negative bit line (/BL in FIG. 28); and 116, a VDD power supply interconnection; and these are formed with the second-layer interconnection 112. In FIG. 25, reference numeral 117 represents a third-layer interconnection, and reference numeral 118 represents a via section of connecting the second-layer interconnection 112 to the third-layer interconnection 117. Further, reference numeral 119 represents a word line (WL in FIG. 28); 120, a VSS power supply interconnection; and these are formed with the third-layer interconnection 117.

As can be seen when comparing a layout of the vertical memory cell of FIG. 20 with that of the horizontal memory cell of FIG. 21, in the horizontal memory cell, the diffusion layer 103 and the gate electrode 104 are straight in shape extended in the same direction, so that it has a layout to facilitate pattern formation, thereby providing a merit that a lithography process thereof would be performed further easily than that of the vertical memory cell. Further, since the cell shape provides a landscape shape, the bit line length extended in a vertical direction becomes shorter compared with that of the vertical memory cell, so that a bit line capacitance is reduced, and thereby also providing a merit that improvement in speed and reduction in power dissipation are advantageously achieved. Since a narrow gate width is used for the transistors within the memory cell for area reduction, and it will further have a configuration that a number of memory cells are connected to the bit line, a drive load of the memory cell is increased, so that a bit line drive time is one of the most important factors in access time improvement in speed.

Incidentally, in the example of the above horizontal memory cell, the description has been made of the example where the bit line has been formed with the second-layer interconnection (hereafter referred to as "second layer bit line type"), and in addition to that, description will be made of an example where the bit line is formed with the third-layer interconnection (hereafter referred to as "third layer bit line type"). The layout of the lower layer section and the first-layer metal interconnection of the third-layer bit line type horizontal memory cell is similar to that of the lower layer section and the first-layer metal interconnection of the second layer bit line type horizontal memory cell shown in FIG. 21 and FIG. 23, respectively. A layout of the second-layer interconnection and a layout of the third-layer interconnection of the third layer bit line type horizontal memory cell are shown in FIG. 26 and FIG. 27, respectively. In this third layer bit line type, a word line 351 is formed with the second-layer interconnection 112 as shown in FIG. 26, and a positive bit line 352, a negative bit line 353, a VDD power supply interconnection 354, and a VSS power supply interconnection 355 are formed with the third-layer interconnection 117 as shown in FIG. 27.

A bit line capacitance to a substrate of the third layer bit line type becomes lower than that of the second layer bit line type. However, since many interconnection patterns exist in the second-layer interconnection, a capacitance difference to the substrate is hardly effective. Further, the via section depth of the third layer bit line type is so deep as compared with the second layer bit line type, and the distance between via sections of the positive/negative bit lines 352, 353 and a via section of the VDD power supply interconnection 354 is so close that there exists a demerit that the parasitic capacitance of the via section of bit lines 352, 353 is increased. Further, as can be seen when comparing FIG. 25 with FIG. 27, since the number of signals transmitted from the lower layer to the upper layer of the third layer bit line type are larger than that of the second layer bit line type, the number of via sections to be used increases, and thereby it may become disadvantageous in yield. However, in the case of the third layer bit line type, the positive/negative bit lines 352, 353 are disposed between the VDD power supply interconnection 354 and the VSS power supply interconnection 355, respectively, as shown in FIG. 27. Thus, both interference between the positive/negative bit lines 352, 353 in the same memory cell, and interference with the bit line in the adjacent memory cell are shielded.

The description has been made of merits such as easiness in lithographic processing and short bit line length in the horizontal memory cell in the above. However, there exists a problem also in the horizontal memory cell.

In the case of the second layer bit line type, the shape is so horizontally long that the interconnections horizontally extended are extremely close to each other. Specifically, the word line 119 and the VSS power supply interconnection 120 which are formed with the same layer as the third-layer interconnection 117 extremely, closely run in parallel for a long distance (within the whole memory area) as shown in FIG. 25, a parasitic load capacitance of the word line 119 is increased with the progress in microfabrication, and an interconnection spacing is so narrow that it becomes weak also against particles or the like caused by the process during fabrication, thereby, there is a problem that a yield drop is apt to be caused.

Further, in the case of the third layer bit line type, since the positive/negative bit lines 352, 353 are disposed between the VDD power supply interconnection 354 and the VSS power supply interconnection 355 as shown in FIG. 27, interference between bit lines in the same memory cell and also in the adjacent memory cell can be shielded; as a result, the VDD power supply interconnection 354 and the VSS power supply interconnection 355, and the positive/negative bit lines 352, 353, which are arranged in a horizontal direction, will run in parallel over a long distance. Although room is still left in breadth for a horizontal memory cell, since there exist many interconnection patterns closely with the progress in microfabrication, there is also a possibility of an increase in a parasitic load capacitance of the bit lines 352, 353, and there is a problem that a yield drop is apt to be caused due to particles.

Further, as attendant circumstances, in the latest system LSI layout, the following trends will be seen with the progress in microfabrication.

(1) Multilayered Interconnection

With the progress in microfabrication, the cross section of the interconnection is decreased in area, and the interconnection spacing is decreased in width, so that interconnection delay is increased. In order to relieve this, there have begun to increase cases where the layout has been performed in such a manner to increase the number of interconnection layers to be used to thereby make the interconnection width and the interconnection spacing wide, and accordingly, there has been a tendency that the interconnection of the system LSI has been multilayered in number.

Because of the needs such as device scaling or a reduction in power dissipation of the apparatus, there has been a tendency that a supply voltage of LSIs has been reduced. However, on the other hand, since a large number of elements have been integrated on one chip, and needs for high-speed operation have also been high, there has been a tendency that a current consumption has been increased. For this reason, there have been increased the need for making the power interconnection large in width to thereby suppress a supply voltage drop, so that there has been a tendency that the number of interconnection layers to be used has been increased.

(2) Redundant Repair Technology

There has been a tendency that the number of transistors to be embedded, in particular, the memory capacity to be embedded has been increased in system LSIs. For this reason, a redundant repair technology having been used for DRAM or the like has begun to be used also for SRAM.

Taking a flow of said (1) and (2) in system LSIs which are fabricated using a micromachining process in recent years into account, it is required to further optimize the interconnection structure of the above-mentioned horizontal memory cell.

SUMMARY OF THE INVENTION

The object of the present invention is to provide a semiconductor memory device in which the parasitic capacitance of a word line or a bit line can be reduced and the yield can also be improved.

A first to fourth semiconductor memory devices according to the present invention, comprises a plurality of CMOS SRAM cells, arranged on a semiconductor substrate in a matrix shape, each being configured of a pair of access transistors, a pair of drive transistors, and a pair of load transistors, each region being a cell region with an elongated shape in a row direction wherein three well regions are formed side by side in a row direction so that a second conductivity type well region may be disposed between two first conductivity type well regions on the semiconductor substrate, and wherein one of the access transistors and one of the drive transistors are formed in each of the two first conductivity type well regions within the cell region, and a pair of the load transistors is formed in the second conductivity type well region; and comprises a plurality of interconnection layers over the transistors which configure the CMOS SRAM cell.

Further, the first semiconductor memory device comprises: a plurality of paired bit lines, formed of one interconnection layer among a plurality of interconnection layers, each being extended in a column direction to be connected to the CMOS SRAM cell in the same column, and arranged in parallel in a row direction; a plurality of high potential side power supply interconnections (VDD power supply interconnection), formed of the same interconnection layer as that of the bit line, and each being arranged between the paired bit lines to be connected to the CMOS SRAM cell in the same column; a plurality of word lines, formed of an interconnection layer upper than that of the bit line by one layer, each being extended in a row direction to be connected to the CMOS SRAM cell in the same row, and arranged in parallel in a column direction; and a low potential side power supply interconnection (VSS power supply interconnection), formed of an interconnection layer upper than that of the word line by one layer, and is connected to the CMOS SRAM cell.

According to this configuration, in a horizontal memory cell with narrow width in a vertical direction (column direction) to which a boundary line between the wells is extended, when the word line is formed of the interconnection layer upper than that of the bit line, the word line and the VSS power supply interconnection are formed of different interconnection layers, so that by shortening a parallel run length of the word line and the area to which the VSS power is applied, both existing extremely closely, and reducing the parasitic capacitance of the word line, it is possible to achieve improvement in speed and by reducing a probability that adjacent interconnections on the same layer fall into a short circuit failure due to particles, it is possible to increase the yield. Further, since the VDD power supply interconnection which also serves as a shield exists between the paired positive/negative complementary bit lines, it is possible to prevent signal amplitude of the bit line from reduction due to the coupling between the positive/negative bit lines. Further, since a probability that the word line would become fault is decreased, it is possible to reduce the amount of mounted circuits for row redundancy, reduce an area by arranging a redundant circuit only at the column side, and prevent an address setup time, an access time or the like from degradation in spec. Further, since the VSS power supply interconnection and the VDD power supply interconnection exist in the different interconnection layers, it is possible to prevent a redundant yield drop caused by a short circuit failure between the VDD and the VSS power supplies.

The second semiconductor memory device comprises: a plurality of word lines, formed of one interconnection layer among a plurality of interconnection layers, each being extended in a row direction to be connected to the CMOS SRAM cell in the same row, and arranged in parallel in a column direction; a plurality of paired bit lines, formed of an interconnection layer upper than that of the word line by one layer, each being extended in a column direction to be connected to the CMOS SRAM cell in the same column, and arranged in parallel in a row direction; a plurality of high potential side power supply interconnections (VDD power supply interconnection), formed of the same interconnection layer as that of the bit line, and each being arranged between the paired bit lines to be connected to the CMOS SRAM cell in the same column; and a low potential side power supply interconnection (VSS power supply interconnection), formed of an interconnection layer upper than that of the bit line by one layer, and connected to the CMOS SRAM cell.

According to this configuration, in a horizontal memory cell with narrow width in a vertical direction (column direction) to which a boundary line between the wells is extended, when the word line is formed of the interconnection layer lower than that of the bit line, since the bit line and the VSS power supply interconnection are formed of different interconnection layers, a parallel run length of the bit line and the VSS power supply which are arranged side by side in a horizontal direction (row direction) is made short, so that the parasitic capacitance of the bit line is decreased, and it is possible to increase the yield by reducing a probability that adjacent interconnections on the same layer fall into a short circuit failure due to particles. Moreover, since the bit line is generally precharged in High potential at the time of standby, the redundant repair ratio is improved if a probability of short circuit between the VSS power supply and the bit line is decreased. Further, since the VDD power supply interconnection which also serves as a shield exists between the paired positive/negative complementary bit lines, it is possible to prevent signal amplitude of the bit line from reduction due to coupling between the positive/negative bit lines. Further, since the VSS power supply interconnection and the VDD power supply interconnection exist in the different interconnection layers, it is possible to prevent a redundant yield drop caused by a short circuit failure between the VDD and VSS power supplies.

The third semiconductor memory device comprises: a plurality of high potential side power supply interconnections (VDD power supply interconnection), formed of one interconnection layer among a plurality of interconnection layers, each being extended in a column direction to be connected to the CMOS SRAM cell in the same column, and arranged in parallel in a row direction; a plurality of paired bit lines, formed of an interconnection layer upper than that of the high potential side power supply interconnection by one layer, each being extended in a column direction to be connected to the CMOS SRAM cell in the same column, and arranged in parallel in a row direction; a plurality of word lines, formed of an interconnection layer upper than that of the bit line by one layer, and each being extended in a row direction to be connected to the CMOS SRAM cell in the same row, and arranged in parallel in a column direction; and a low potential side power supply interconnection (VSS power supply interconnection) formed of an interconnection layer upper than that of the word line by one layer, and connected to the CMOS SRAM cell.

According to this configuration, the VDD power supply interconnection which also serves as a shield between the positive/negative bit lines in the first semiconductor memory device is arranged in an interconnection layer which is one layer lower than and different from that of the bit line, so that a bit line capacitance is reduced. A transition speed of a voltage of a targeted bit line becomes faster by the amount of capacitance reduction. Thus, a high-performance SRAM block using, for example a five-layer interconnection can be provided.

The fourth semiconductor memory device comprises: a plurality of paired bit lines, formed of one of the plurality of interconnection layers, each being extended in a column direction to be connected to the CMOS SRAM cell in the same column, and arranged in parallel in a row direction; a plurality of high potential side power supply interconnections (VDD power supply interconnection), formed of an interconnection layer upper than that of the bit line by one layer, each being extended in a column direction to be connected to the CMOS SRAM cell in the same column, and arranged in parallel in a row direction; a plurality of word lines, formed of an interconnection layer upper than that of the high potential side power supply interconnection by one layer, each being extended in a row direction to be connected to the CMOS SRAM cell in the same row, and arranged in parallel in a column direction; and a low potential side power supply interconnection (VSS power supply interconnection), formed of an interconnection layer upper than that of the word line by one layer, and connected to the CMOS SRAM cell.

According to this configuration, the VDD power supply interconnection which also serves as a shield between the positive/negative bit lines in the first semiconductor memory device is arranged in an interconnection layer which is one layer upper than and different from that of the bit line, so that a bit line capacitance is reduced. A transition speed of a voltage of a targeted bit line becomes faster by the amount of capacitance reduction. Thus, a high-performance SRAM block using, for example a five-layer interconnection can be provided.

Further, in the first to fourth semiconductor memory devices, a width in a row direction of each region of the CMOS SRAM cell is not two times smaller than a width in a column direction thereof, namely, when the width in a horizontal direction of the memory cell (CMOS SRAM cell) is not two times smaller than that in a vertical direction, a higher effect will be provided according to a configuration of the first to fourth semiconductor memory devices.

In the third and fourth semiconductor memory devices, the word line is connected to the access transistor in the CMOS SRAM cell via an island-shaped pattern formed of an interconnection layer lower than that of the word line by one layer, and a connection between the word line and the island-shaped pattern may be made by arranging a plurality of via sections per island-shaped pattern.

According to this configuration, in order to connect to the word line formed of the upper interconnection layer, the plurality of via sections are used per node (island-shaped pattern) lower than that, so that a probability that all those via sections will become faulty is significantly decreased as compared with a case of arranging one via section, thereby a yield drop can be suppressed.

In the first to fourth semiconductor memory devices, the low potential side power supply interconnection (VSS power supply interconnection) is connected to the CMOS SRAM cell via an island-shaped pattern for low potential side power supply formed of an interconnection layer lower than that of the low potential side power supply interconnection by one layer, and a connection between the low potential side power supply interconnection and the island-shaped pattern for low potential side power supply may be made by arranging a plurality of via sections per island-shaped pattern for low potential side power supply.

According to this configuration, in order to connect to the VSS power supply interconnection formed of the upper interconnection layer, the plurality of via sections are used per node (island-shaped pattern) lower than that, so that a probability that all those via sections will become faulty is significantly decreased as compared with a case of arranging one via section, thereby a yield drop can be suppressed.

In the first to fourth semiconductor memory devices, the low potential side power supply interconnection (VSS power supply interconnection) is connected to the CMOS SRAM cell via the island-shaped pattern for the low potential side power supply formed of the same interconnection layer as that of the word line, and in order to make the spacing between the island-shaped pattern for the low potential side power supply and the word line large in width, or in order to make a line width of the word line wide, the word line may be bent.

According to this configuration, when the spacing between the word line and the island-shaped pattern for low potential side power supply existing in the same layer is made wider by bending the thin word line, it is possible to reduce a word line capacitance and decrease a probability of occurrences of a short circuit failure therebetween. Further, when the word line is made wide, it is possible to decrease a word line resistance and reduce a probability of fault occurrences due to word line breaking.

In the first to fourth semiconductor memory devices, a plurality of low potential side power supply interconnections (VSS power supply interconnection) may be arranged in parallel in a row direction, and arranged so as to cover the bit line.

According to this configuration, the VSS power supply interconnection is arranged in parallel in a horizontal direction (row direction), so that it is possible to achieve a configuration having one VSS power supply interconnection per memory cell. When provided with the VSS power supply interconnection arranged in parallel in a vertical direction (column direction), although a cell current of all memory cells that are connected to the word line will be provided by one VSS power supply interconnection during the word line is active, rather than that, a supply voltage drop and effect of electromigration can be relieved. Additionally, since the VSS power supply interconnection exists so as to cover the bit line existing in a lower layer, it serves as a shield layer against a signal passing through the memory block, so that while preventing malfunctions of the memory, it is possible to pass a signal line over the memory block on designing chips.

In the first to fourth semiconductor memory devices, there may be provided a high potential side power supply reinforcement interconnection which is formed of the same interconnection layer as that of the low potential side power supply interconnection (VSS power supply interconnection), and is connected to the high potential side power supply interconnection (VDD power supply interconnection).

According to this configuration, when a current supply source capacity is insufficient only by means of the lower layer VDD power supply interconnection, by providing the high potential side power supply reinforcement interconnection (VDD reinforcement interconnection) in the upper layer as a parallel path, it is possible to reinforce the current supply source capacity.

In this case, by providing a connection between the VDD reinforcement interconnection and the VDD power supply interconnection in a substrate contact cell region for ensuring a substrate potential of a transistor which configures the CMOS SRAM cell, the following effects can be obtained. If the lower layer VDD power supply interconnection is connected to the upper VDD reinforcement interconnection on each memory cell, interconnection patterns which run in parallel to, for example the word line or the like will increase in number. By backing the VDD power supply with the same period as an arrangement period in the substrate contact cell region, or with a period having an integral multiple thereof, while avoiding a load capacitance increase and a yield drop of the word line, the VDD power supply can be made into a mesh structure. Since the word line is in Low potential when it is not used, if a fault word line is in Low potential, a redundant repair can be provided; however when it is in High potential because of a short circuit to a VDD potential, even when a row redundant function is provided, there may also arise a problem that a redundant repair ratio is not improved. However, according to this configuration, while avoiding a probability of short circuit between the word line and the VDD potential, it is possible to make the VDD power supply into a mesh structure.

In the first to fourth semiconductor memory devices, there may be provided a power supply reinforcement interconnection which is formed of the same interconnection layer as that of the word line within a substrate contact cell region for ensuring a substrate potential of a transistor which configures the CMOS SRAM cell, and is extended in a row direction; and the power supply reinforcement interconnection may be connected to the high potential side power supply interconnection or the low potential side power supply interconnection in the intersection point to the high potential side power supply interconnection or the low potential side power supply interconnection.

According to this configuration, the VSS power supply interconnection and the VDD power supply interconnection are connected to the power supply reinforcement interconnection also in a horizontal direction to thereby make into a mesh structure, so that it is possible to form a further solid and stable power supply system.

In the first to fourth semiconductor memory devices, the low potential side power supply interconnection may be formed into a mesh shape.

According to this configuration, the VSS power supply interconnection is made into a mesh shape, so that it is possible to form a further solid and stable VSS power supply system.

In the third and fourth semiconductor memory devices, a film thickness of an interconnection layer forming the word line may be made thicker than a film thickness of an interconnection layer lower than the word line.

According to this configuration, since the film thickness of the interconnection of the word line is thicker than the film thickness of the interconnection layer lower than the word line, a sheet resistance value is reduced. Thus, a parasitic resistance of the word line is reduced and an interconnection delay can be suppressed.

In the first to fourth semiconductor memory devices, a film thickness of an interconnection layer forming the low potential side power supply interconnection may be made thicker than a film thickness of an interconnection lower than the low potential side power supply interconnection.

According to this configuration, since the film thickness of the interconnection of the VSS power supply interconnection is thicker than the film thickness of the interconnection lower than that, a sheet resistance value is reduced. Thus, a parasitic resistance of the power supply is reduced and a current supply source capacity of the power supply is increased. Further, since other signal lines do not exist in the interconnection layer of the VSS power supply interconnection at least in the memory cell region, even when the interconnection layer of the VSS power supply interconnection is made thicker, there does not arise a problem that a coupling noise between the same layer signal lines is increased.

In the first semiconductor memory device, it may also be a configuration which does not have a row redundant circuit but has only a column redundant circuit as a redundant circuit.

According to this configuration, an advantage of the first semiconductor memory device that there are few probability of short circuit failure between the word line and the VSS power supply extended in a row direction is effectively used, and only the column redundant circuit is mounted as a redundant circuit, so that an increase in an area by means of mounting the row redundant circuit is avoided, and the area is reduced, and thereby the memory block with high performance can be achieved.

In the second semiconductor memory device, it may also be a configuration which does not have a column redundant circuit but has only a row redundant circuit as a redundant circuit.

According to this configuration, an advantage of the first semiconductor memory device that there are few probability of a short circuit failure between the bit line and the VSS power supply is used effectively, only the row redundant circuit is mounted as the redundant circuit, so that an increase in an area is avoided by means of mounting the column redundant circuit to reduce the area, and thereby the memory block with high performance can be achieved.

DETAILED DESCRIPTION OF THE PREFERRED EMBODIMENTS

Figure 1:
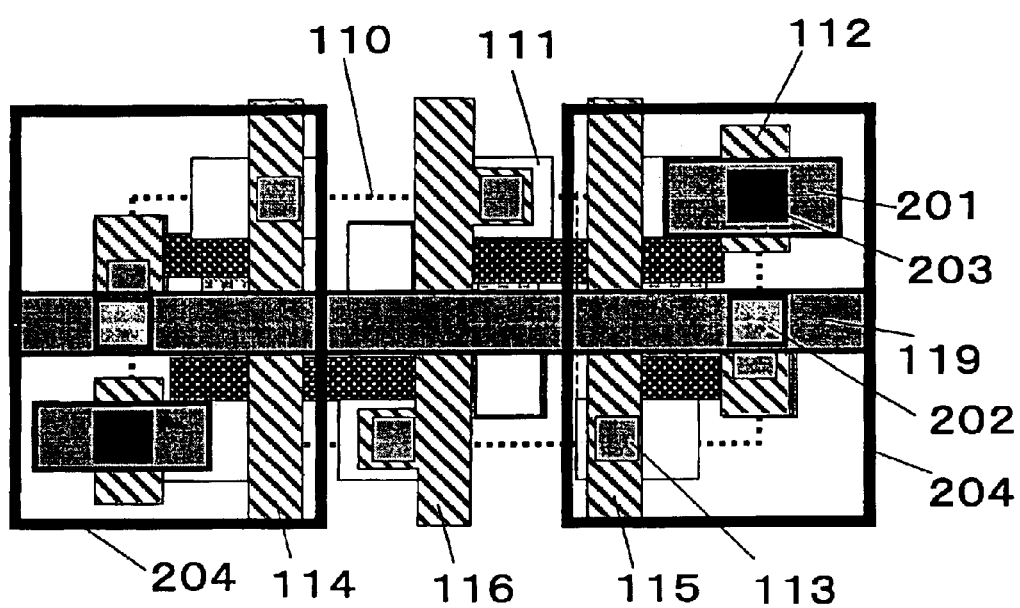
FIG. 1 is a drawing showing a memory cell layout concerning a first embodiment according to the present invention.

Referring to the drawings, description will be made of embodiments according to the present invention. Incidentally, in the following description, an n-th-layer interconnection (n=1, 2, 3, . . . ) represents an interconnection, which is formed on a layout of a lower layer section of a memory cell, and formed of a metal interconnection layer of the n-th layer from the bottom similar to a conventional example.

First Embodiment

A first embodiment will be described using the drawings. A semiconductor memory device according to this embodiment represents a CMOS SRAM comprising a horizontal memory cell of a second layer bit line type.

Figure 21:
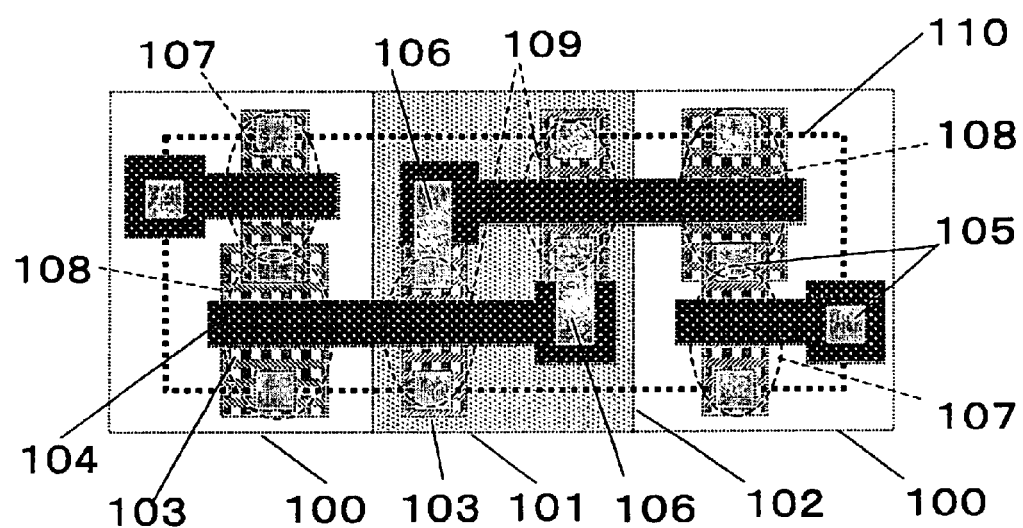
FIG. 21 is a drawing showing a layout example of a lower layer section of a conventional horizontal memory cell.
Figure 22:
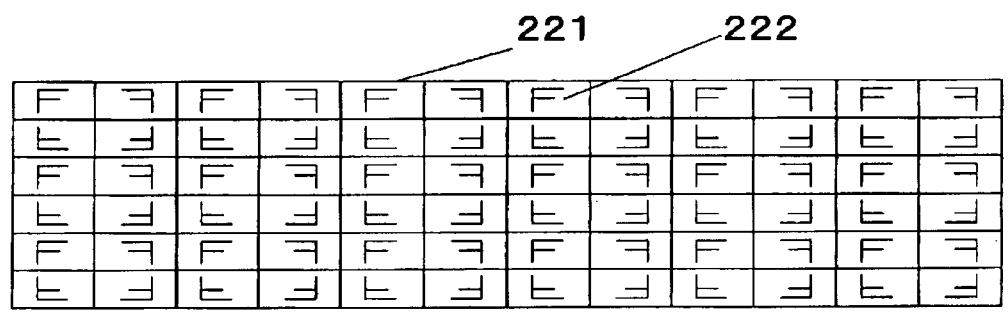
FIG. 22 is a drawing showing an arrangement method of a horizontal memory cell.
Figure 28:
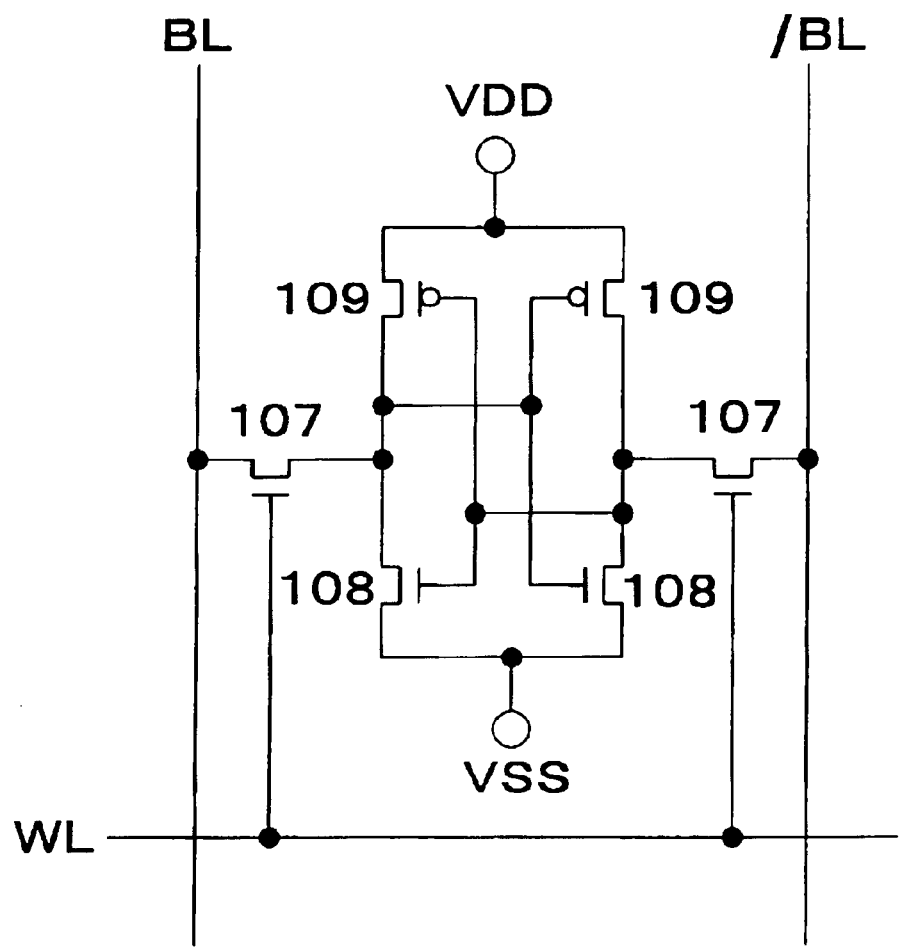
FIG. 28 is a circuit diagram of a memory cell of a CMOS SRAM.

A layout of a lower layer section of the horizontal memory cell in this embodiment, and a layout of a first-layer interconnection and a second-layer interconnection upper than that are similar to those of conventional examples of FIGS. 21 to 24; and further an arrangement of the memory cell is also arranged in flip as shown in FIG. 22, and a circuit diagram of the memory cell is shown in FIG. 28. An example of an interconnection layout according to this embodiment is shown in FIG. 1. In FIG. 1, reference numerals 201, 202, 203, and 204 represent a VSS node with an island-shaped pattern formed with a third-layer interconnection, a via section of connecting the second-layer interconnection to the third-layer interconnection, a via section of connecting the third-layer interconnection to a fourth-layer interconnection, and a VSS power supply interconnection formed with the fourth-layer interconnection, respectively.

Figure 25:
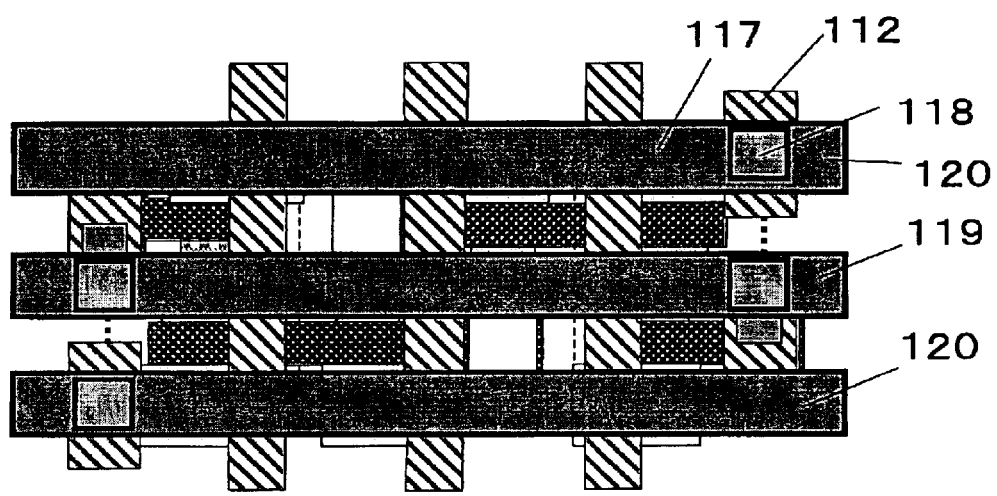
FIG. 25 is a drawing mainly showing a third-layer interconnection and a via section of connecting the third-layer interconnection to a layer lower than that in a layout example of a conventional second layer bit line type horizontal memory cell.
Figure 26:
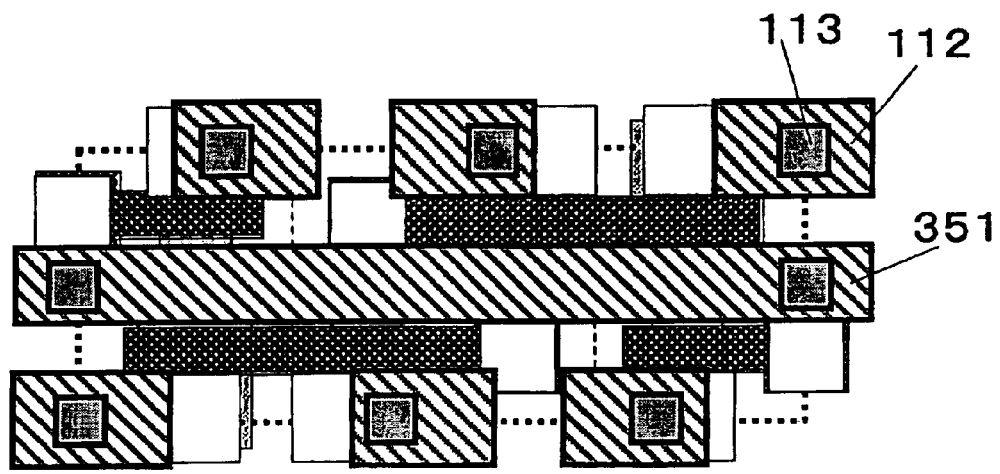
FIG. 26 is a drawing mainly showing a second-layer interconnection and a via section of connecting the second-layer interconnection to a layer lower than that in a layout example of a conventional third layer bit line type horizontal memory cell.

Although in a the conventional second-layer bit line type horizontal memory cell, a VSS power supply interconnection 120 has run in parallel to a word line 119 formed with a third-layer interconnection as shown in FIG. 25, in this embodiment, only a VSS node 201 with the island-shaped pattern for connection to make the VSS power supply pass from the upper layer to the lower layer is formed with a third-layer interconnection, and the VSS power supply interconnection 204 is formed with the fourth-layer interconnection upper than that as shown in FIG. 1.

Thus, since a parallel run over a long distance between the word line 119 and the VSS power supply interconnection 204 is eliminated, the parasitic capacitance of the word line 119 is reduced, thereby an improvement in speed can be achieved; and a probability that the word line 119 and the VSS power supply interconnection 204 fall into short circuit failure due to particles is reduced, thereby an effect of increasing the yield can be achieved. This effect will become further significant in a case where a memory cell has a landscape shape with an aspect ratio equal to two times or more.

In addition, since the VDD power supply interconnection 116 exists between the positive/negative bit lines 114, 115, it will serve as a shield between the positive/negative bit lines 114, 115 similar to the conventional example. If there is no shield layer and a coupling capacitance between the positive/negative bit lines 114, 115 is large, when one bit line potential changes to Low potential on Write/Read operation of the memory, another bit line to be in High potential is drawn to Low potential, and a potential difference between the positive/negative bit lines 114, 115 decreases, so that a possibility of causing a sense problem on Read and a problem on Write operation will be increased. It will not generally become a significant problem that the VDD power supply interconnection 116 runs in parallel to the bit lines 114, 115, as far as there exists a column redundant repair. Since the bit lines 114, 115 will generally be precharged at High potential to be in a standby state, even when the VDD power supply interconnection and the bit line are short-circuited, a DC fault current or the like does not flow by means of skipping the fault bit line portion using the redundant circuit, and thereby it can be treated as a non defective chip.

However, in FIG. 1, in order to form the VSS power supply interconnection 204 with the fourth-layer interconnection, the via section 203 of connecting the third-layer to the fourth-layer interconnection is required. A via section formation process is a process in which a deep hole having a very high aspect ratio is opened in an interlayer insulating film, the hole is filled with a metal material, and is also a process having a high degree of difficulty in fabrication. For this reason, if the number of layers of the via section required for composing logics increases, even when a parallel run length of the interconnections is reduced, as a result, there is a concern that the yield will be decreased.

Figure 2:
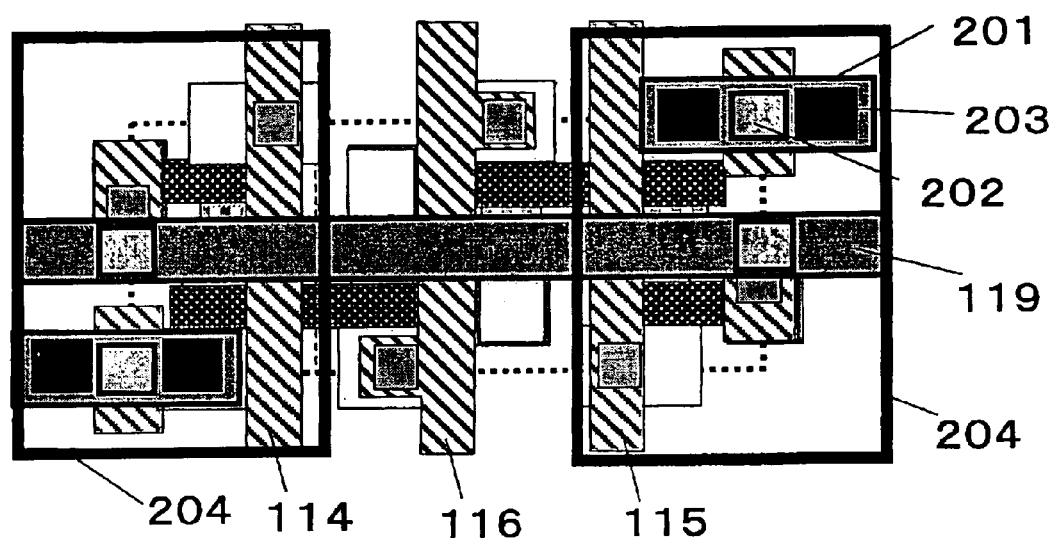
FIG. 2 is a drawing showing a memory cell layout where two via sections for connection to a VSS interconnection of a fourth layer is provided per connecting area concerning the first embodiment.
Figure 3:
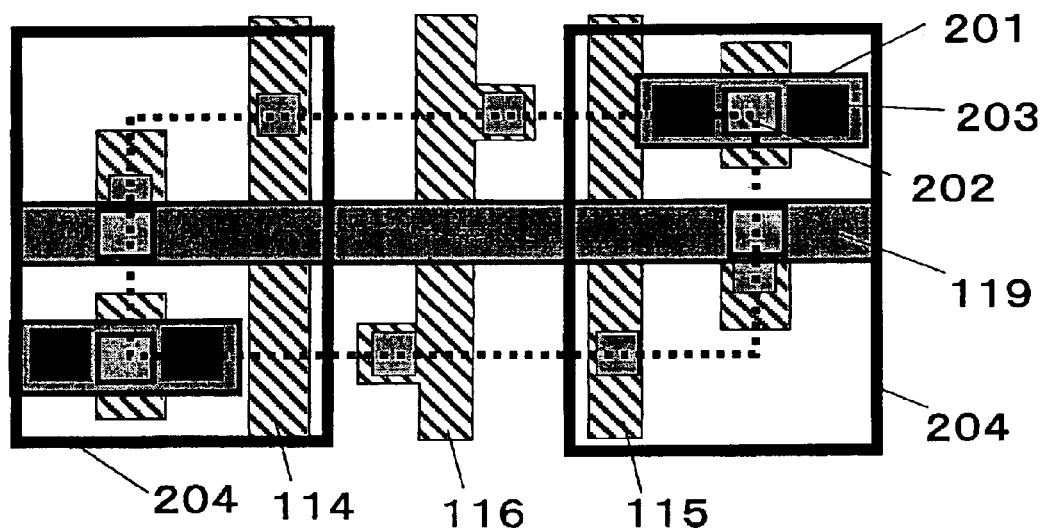
FIG. 3 is a drawing showing a memory cell layout illustrating a second-layer interconnection and an interconnection upper than that in FIG. 2.

To provide a plurality of via sections per connecting area will be a countermeasure for this. FIG. 2 is an example showing two via sections 203 of connecting the third-layer interconnection to the fourth-layer interconnection are provided per connecting area. FIG. 3 is a drawing showing only the metal interconnections equal to or upper than the second layer in FIG. 2 for easy understanding.

Supposing a probability that one via section falls into a formation fault is 1 ppm, a probability that both of the two vias will become faulty at the same time is the square of 1 ppm, resulting in a very low probability. As a matter of fact, since both of them exist within a close location, it does not become the square thereof completely, but a tendency that a probability of the formation fault caused by the fabrication process is remarkably decreased is correct. Further, in changing the number of the via sections per connecting area from one to two, the island-shaped pattern of the VSS node 201 of the third layer does not become large up to twice in many cases. It is because there are many cases where even when the via section is, for example one in number per connecting area, a size of the island-shaped pattern is not determined by a size of the via section 203 and an overlap rule with respect to the via section, but a size rule of an independent interconnection pattern determined by lithography or interconnection plug properties on a damascene interconnection process. Therefore, there is little increase in an area of the island-shaped pattern of the VSS node 201 of the third layer by making the via section into two from one in number, and there is also little increase in a word line parasitic load capacitance and little decrease in yield. Consequently, by providing a plurality of via sections per connecting area of connecting the VSS node 201 of the third layer to the VSS power supply interconnection 204 of the fourth layer, it becomes possible to exploit the effect of arranging the VSS power supply interconnection 204 in the fourth layer to the maximum extent.

Figure 4:
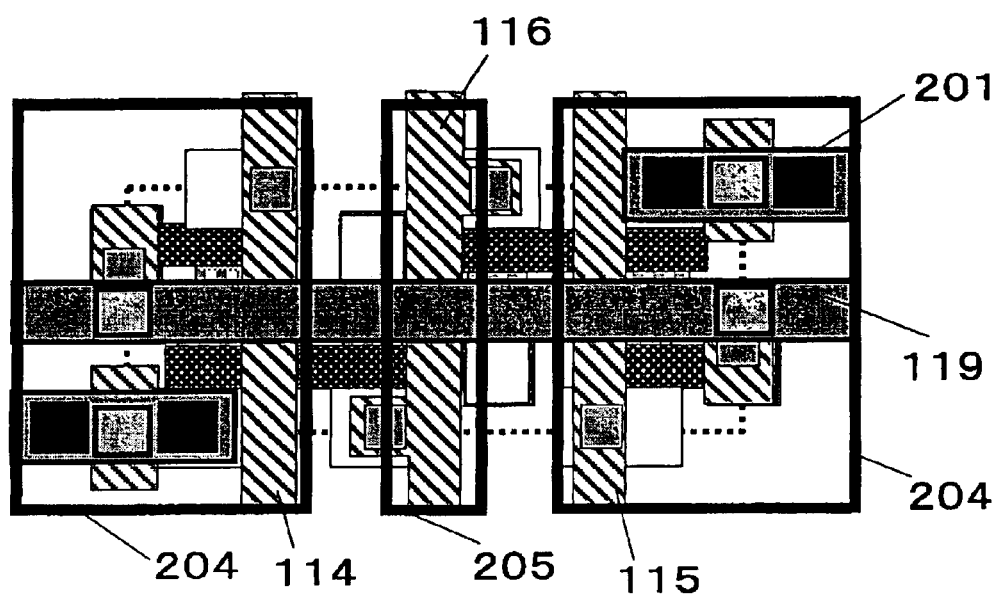
FIG. 4 is a drawing showing an example having VDD and VSS in the fourth-interconnection concerning the first embodiment.

Next, an example of reinforcing the VDD power supply will be described using FIGS. 4 to 7. As can be seen from FIG. 3, only the VSS power supply interconnection 204 exists in the fourth-layer interconnection layer, and there exists room in the layout. It is therefore possible to make the VDD power supply interconnection 205 of the fourth-layer interconnection pass over a P-channel load transistor as is shown in FIG. 4.

When the sufficient power supply capacity can not be obtained only from the VDD power supply interconnection 116 since the parasitic resistance value of the VDD power supply interconnection 116 of the second-layer interconnection is high, the VDD power supply can be reinforced by means of backing the VDD power supply interconnection 116 of the second-layer interconnection by the VDD power supply interconnection 205 of the fourth-layer interconnection.

Figure 5:
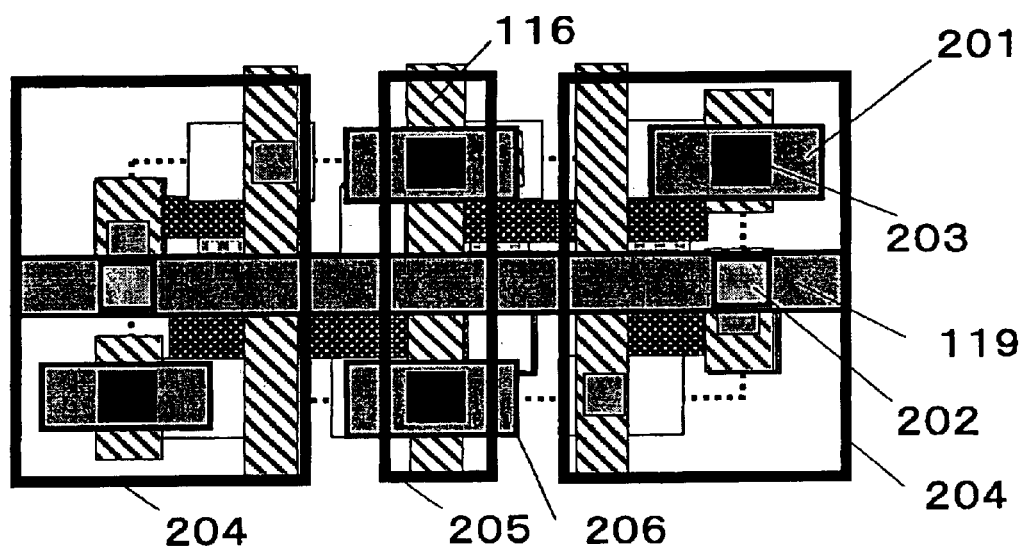
FIG. 5 is a drawing showing such a bad example as to back VDD in a memory cell having VDD and VSS in the fourth-layer interconnection concerning the first embodiment.

Further, in order to connect the VDD power supply interconnection 205 of this fourth layer to the VDD power supply interconnection 116 of the second layer running on a lower layer, when the power node 206 with the island-shaped pattern of the third-layer interconnection is formed within each memory cell to connected to the VDD power supply interconnection 116 of the second layer as shown in FIG. 5, a parallel run length among the word line 119, the island-shaped VDD power node 206, and the island-shaped VSS power node 201 in the third layer increases, so that an increase in parasitic capacitance and a decrease in yield will arise.

Figure 6:
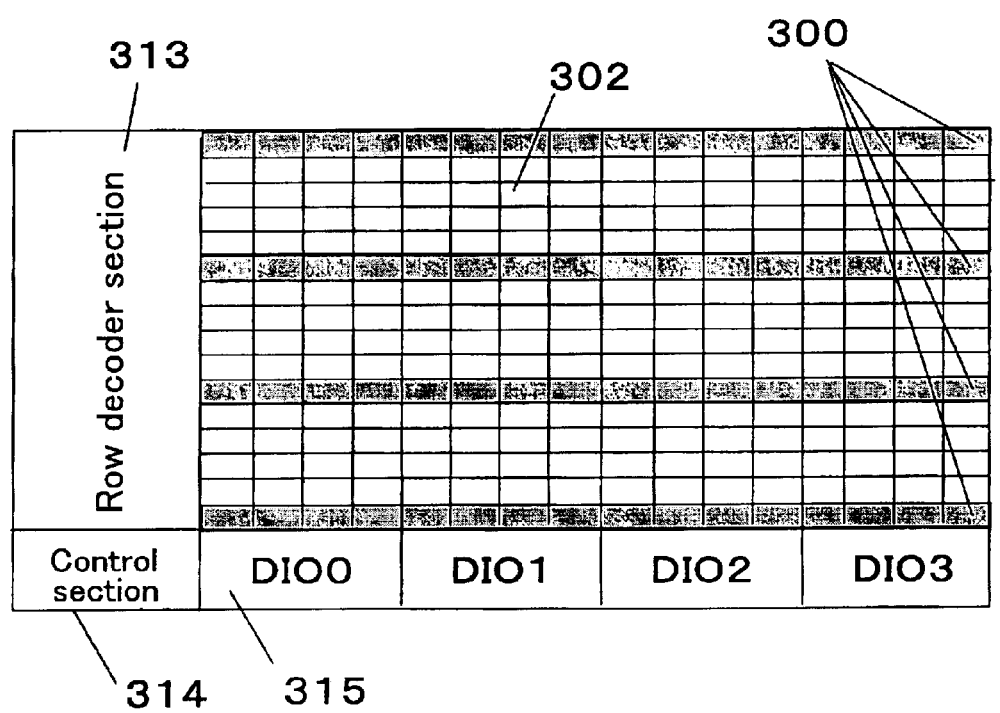
FIG. 6 is a drawing showing an example of a substrate contact cell insertion in an SRAM block concerning the first embodiment.
Figure 7:
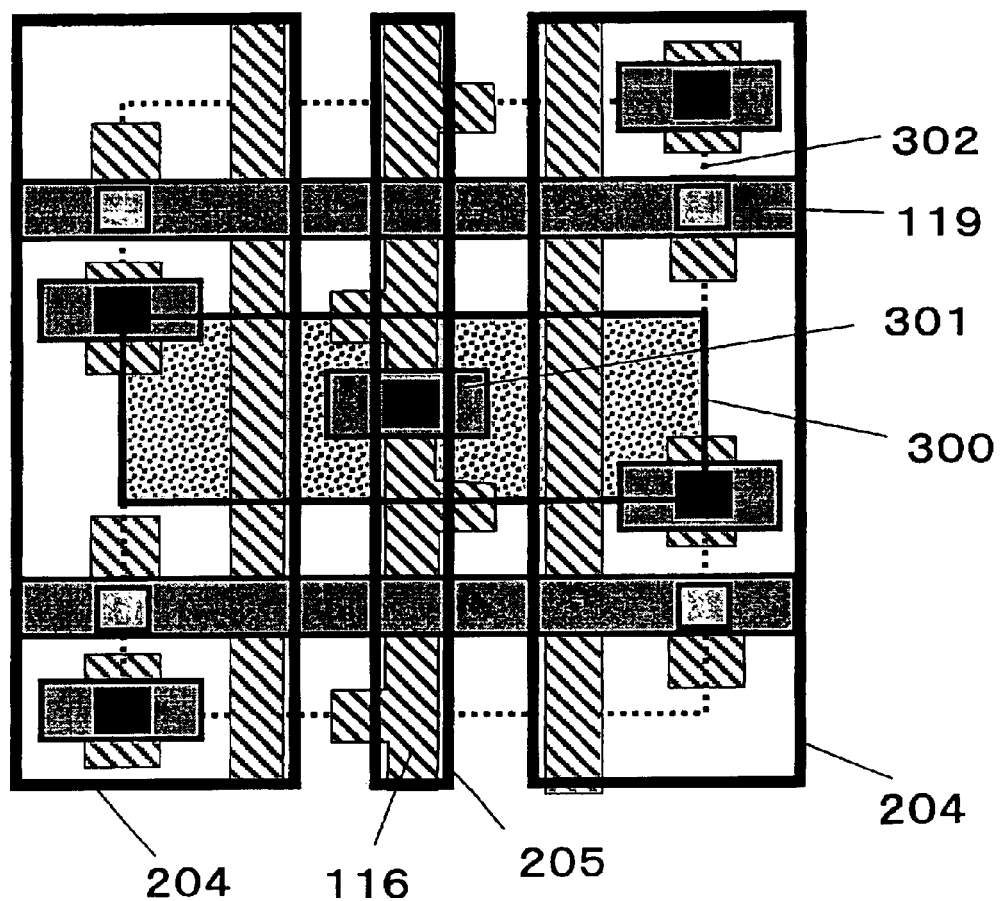
FIG. 7 is a drawing showing a layout of backing VDD in a substrate contact cell concerning the first embodiment.

For this reason, in this embodiment, in a cell 300 which is periodically arranged in the memory cell array to take a substrate contact (Hereafter referred to as "substrate contact cell". For conceptual explanation, there is shown in FIG. 6 in which the number of memory cells 302 arranged between substrate contact cells 300 is fewer than the actual number) as shown in FIG. 6, the second layer VDD power supply interconnection 116 and the fourth layer VDD power supply interconnection 205 are connected via a VDD node 301 of the third-layer interconnection as shown in FIG. 7. Since the word line does not exist in the substrate contact cell section, the third layer is empty. Although the VDD node 301 of the third layer is shown as an island-shaped layout in FIG. 7, it may be formed also as an interconnection extended in a horizontal direction over the memory array only in the substrate contact cell section. Further, as for the third layer reinforcement power supply in a horizontal direction arranged in the substrate contact cell section, VDD and VSS may be arranged, and VDD and VSS may also be alternately arranged. Thereby, a yield drop can be suppressed and a power supply capacity can be reinforced as compared with a case where the VDD connection is made for every memory cell as shown in FIG. 5.

Incidentally, in the example of FIG. 1, and the example of FIG. 2 (FIG. 3), only the VSS power supply interconnection 204 exists in the fourth-layer interconnection, and the VDD power supply interconnection 205 like FIG. 4 does not exist therein. When VDD and VSS existing in the same layer metal are short-circuited thterebetween to thereby become a failure, since a short circuit current which flows between VDD and VSS cannot be prevented by the redundant technique of only skipping a fault cell and using a spare cell, it is impossible to repair a defective chip into a non defective chip by means of the redundant repair. In particular, a plug construction method called damascene is used for the latest copper interconnection formation, if there exist rubbishes in a CMP polishing process, the interconnection may be short-circuited due to an abrasion called a micro scratch. For this reason, even when a sufficient interconnection spacing expected from ability of lithography or controlled particles is ensured, an interconnection short circuit failure may arise.

That is, the short circuit failure between the VDD power supply and the VSS power supply cannot be repaired by a redundant repair technique of substituting a memory cell for a spare cell, a redundant yield drop caused by a short circuit failure between power supplies can be prevented by making only the VSS power supply interconnection 204 exist in the fourth layer of the memory cell as shown in the example of FIG. 1, and the example of FIG. 2 (FIG. 3), and it is very effective considering the redundant repair yield. Further, since an area ratio that the memory cell occupies on a memory block is extremely high and a ratio that a memory area occupies on a system LSI is also extremely high, it is effective also to a chip yield to cope with the memory cell.

Although a pattern of the VSS power supply interconnection 204 arranged on the fourth layer may be formed into a complete plate shape, it may be suitable for the latest copper damascene interconnection to be formed into a line-and-space shape or a mesh shape as will be mentioned later. It is because a large interconnection in width tends to cause recesses in an interconnection section called dishing generated from a polishing pad having elasticity at a CMP process, and the flatness becomes worse, so that a lithography fault or the like due to shortage of a focus depth is apt to be caused. The VSS power supply interconnection 204 is formed into a line-and-space shape or a mesh shape, so that the pattern area can be contained in a specified pattern area range within a certain area, and thereby a layout pattern with easy a process fabrication can be obtained.

When making the pattern of the VSS power supply interconnection 204 of the above-mentioned fourth layer into a mesh shape, the VSS power supply interconnection 204 extended in a vertical direction in FIG. 1 and FIG. 2 (FIG. 3) is further connected also in a horizontal direction to be made into a mesh-shaped power supply. Thereby, it is possible to form a further solid and stable VSS power supply system. This may be made into a mesh shape by being connected per memory cell, and may be made into a mesh shape by being connected only in the substrate contact cell section. Further, since only the VSS power supply interconnection exists in the fourth layer, a merit about the redundant repair yield mentioned above is not lost, either.

Further, the VSS power supply interconnection 204 is extended in the same direction as a boundary line between the wells of P-well and N-well so as to cover the bit lines 114, 115 in the example of FIG. 1, and the example of FIG. 2 (FIG. 3). Supposing the VSS power supply interconnection is extended in a horizontal direction, since memory cells horizontally aligned in one line which have been selected by the word line 119 extended in a horizontal direction turn on all at once as operation of the memory, total amount of current of a number of memory cells must be provided with the one VSS power supply interconnection extended in a horizontal direction. However, if it has the VSS power supply interconnection 204 in a vertical direction, the VSS power supply is provided for every memory cell, so that even when the memory cells horizontally aligned in one line are simultaneously selected by the word line 119, the amount of supply voltage drop can be suppressed.

Incidentally, even when the VDD power supply interconnection does not exist in the fourth layer, it cannot become a large demerit as SRAM. It is because since to pull the bit line up to the VDD potential after Write/Read operation, is performed by a precharge transistor arranged outside the memory cell region, such as I/O section or the like, the VDD power supply in the memory cell may have capabilities only of pulling the bit line up to a high potential side, and inverting storage data of its own cell during Write, so that there is no necessity of having so solid and stable current supply source capacity.

Further, the VSS power supply interconnection 204 of the fourth-layer interconnection is arranged so as to cover the bit lines 114, 115, so that it functions as a shield when another signal line on the chip is passed in the upper layer of the memory block. The fourth layer VSS power supply interconnection 204 exists as a shield, so that the bit lines 114, 115 which are operated by a fine potential difference can be protected, and thereby malfunction due to a noise can be prevented.

Next, a method for making the power supply of VDD or VSS into a mesh structure to reinforce will be described. When the VDD power supply interconnection 116 and the VSS power supply interconnection 204 are extended in a vertical direction as the example of FIG. 1, and the example of FIG. 2 (FIG. 3), there is a case where it is desired that the VDD power supply and the VSS power supply are also interconnected in a horizontal direction at a certain spacing to make into a mesh structure. In such a case, the VDD power supply or the VSS power supply is reinforced with the third-layer interconnection in a perpendicular direction with respect to the boundary line between the wells. When the substrate contact cell section is formed with minimum height, a space where VDD and VSS can pass is the extent to which one third-layer interconnection can pass horizontally. Since the word line 119 does not exist in the substrate contact cell section, VSS or VDD is made to pass, or VDD and VSS are made to alternately pass in a horizontal direction in the third-layer interconnection in this substrate contact cell section, this interconnection that has been made to pass is connected to the VDD power supply interconnection 116 or the VSS power supply interconnection 204 at an intersection point, so that the power supply can be made into a mesh structure to reinforce.

Further, in each example shown in FIGS. 1 to 4 or the like mentioned above, the island-shaped VSS node 201 of the third layer only exists in a diagonal location on both sides of the word line 119. For this purpose, the word line 207 of the third layer is bent within the memory cell as shown in an example of FIG. 8. Since the memory cell is arranged in flip as shown in FIG. 22, the word line is connected without any problems in this shape. When the width thereof is thin like the word line 207 of FIG. 8, the spacing to the island-shaped VSS node 201 becomes wider, so that an interconnect capacitance is reduced to thereby a yield problem due to particles can be suppressed. Further, when making the interconnection width wider to make into a bent type word line with wider width 208 as shown in FIG. 9, a word line resistance can be suppressed smaller and a possibility of a broken failure of the word line 208 is also reduced. As for the bending of the word lines 207, 209, they may be bent at 45 or 90 degrees, and alternatively, may be smoothly bent using many steps with fine step height.

Figure 8:
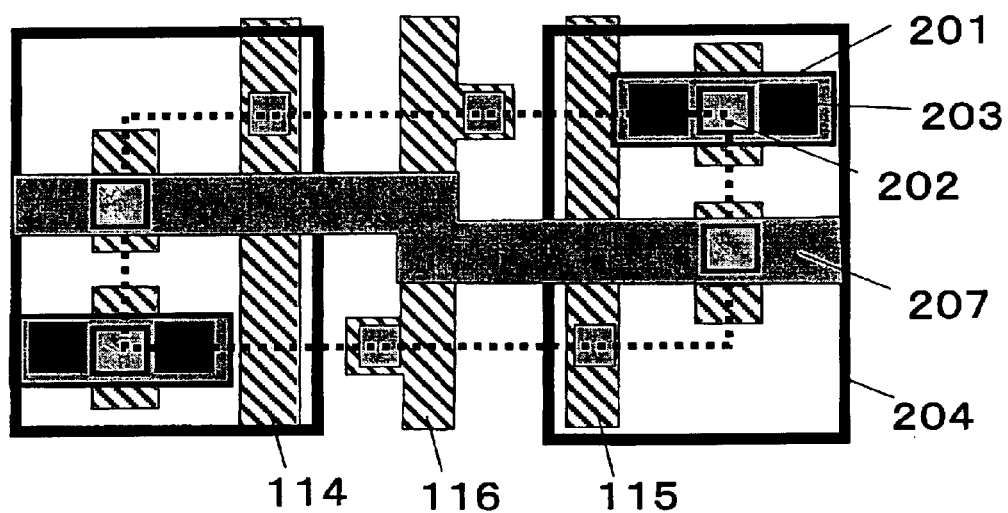
FIG. 8 is a drawing showing a memory cell layout illustrating the second-layer interconnection and an interconnection upper than that and has a bent word line concerning the first embodiment.
Figure 9:
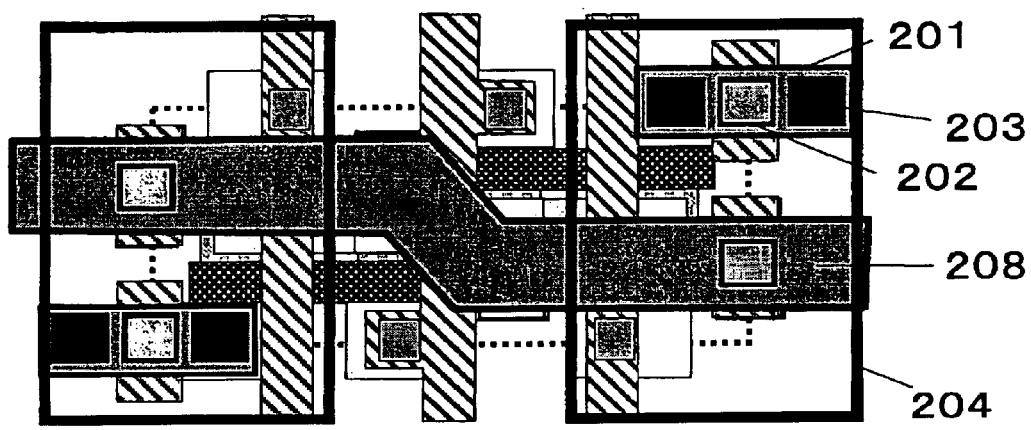
FIG. 9 is a drawing showing a memory cell layout having a bent word line being thin concerning the first embodiment.

Further, in the example of FIG. 1, FIG. 2 (FIG. 3), or FIG. 8, the film thickness of the interconnection of the fourth layer may be made thicker. Since only the VSS power supply interconnection 204 exists in the fourth layer and major signal lines, such as bit line or word line, do not exist therein at least in the memory cell section, an increase in coupling capacitance between short-distance signal interconnections will not become a problem even when the film thickness is made thicker, so that only a merit that the sheet resistance value is decreased can sufficiently be utilized. The power supply capacity required for the memory cell for VSS is higher than that for VDD. The VDD power supply interconnection 116 existing in the second layer is not required such a high power supply capacity that a sufficient power supply capacity can be provided even when the film thereof is small in thickness.

Figure 10:
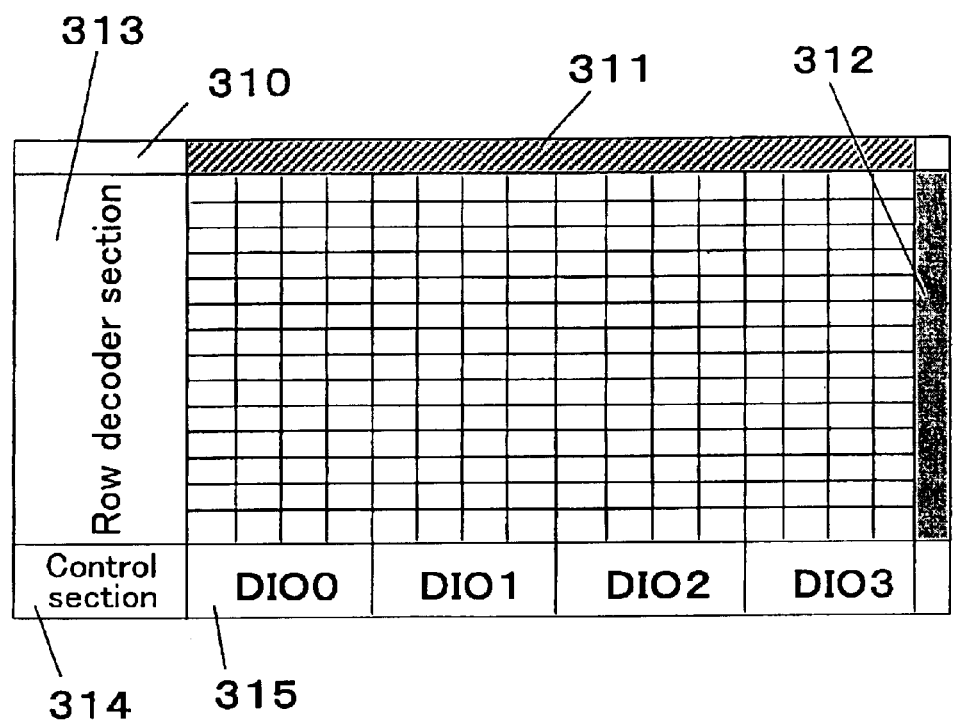
FIG. 10 is a layout image drawing of a block mounting a row redundancy and a column redundancy concerning the first embodiment.

In this embodiment mentioned above, since only the VSS node 201 is arranged in the island-shaped pattern on the third layer which is the same layer as that of the word line 119 extended in a row direction is arranged as is described using FIG. 1, a probability that the word line 119 and the VSS power supply fall into a short circuit failure is decreased. A redundant circuit not having a row redundant circuit but having only a column redundant circuit can be configured by utilizing this advantage of the memory cell. This will be described using FIG. 10. FIG. 10 is a block image drawing when mounting both the row redundant circuit and the column redundant circuit.

In FIG. 10, reference numerals 310, 311, 312, 313, 314, and 315 represent a row decoder for redundant repair, a spare memory cell for row redundancy, a spare memory cell for column redundancy, a row decoder section, a control section, and a data input/output section, respectively.

Although there are various methods for the redundant repair depending on implementation means, an additional circuit such as a selector circuit and an address match detection circuit for shift redundancy, and a memory cell for spare are surely required. This has a demerit of an increase in an area, and additionally, there also exists a demerit where major specifications on memory characteristics, such as an address setup time and an access time or the like are degraded. Since a probability of collectively becoming a failure in a word line direction because the word line is short-circuited to VSS decreases by using the memory cell in this embodiment, the need of mounting the row redundancy repair circuit is reduced. In this case, if using the bending word line shown in FIGS. 8 and 9, the fault of the word line can be further suppressed.

By using this memory cell in which a fault in a word line direction hardly occurs, the redundant circuit and the spare memory cell mounted thereon are used only for column redundancy, so that the row decoder 310 for redundant repair and the spare memory cell 311 for row redundancy in FIG. 10 can be removed, and thereby the area can be reduced. Further, the address matching circuit for row redundancy, the circuit for shift redundancy, and the like included in the control section 314 and the row decoder section 313 are eliminated, so that it can be avoided by mounting the redundant repair circuit that the major specifications on memory characteristics, such as the address setup time and the access time are degraded.

Figure 27:
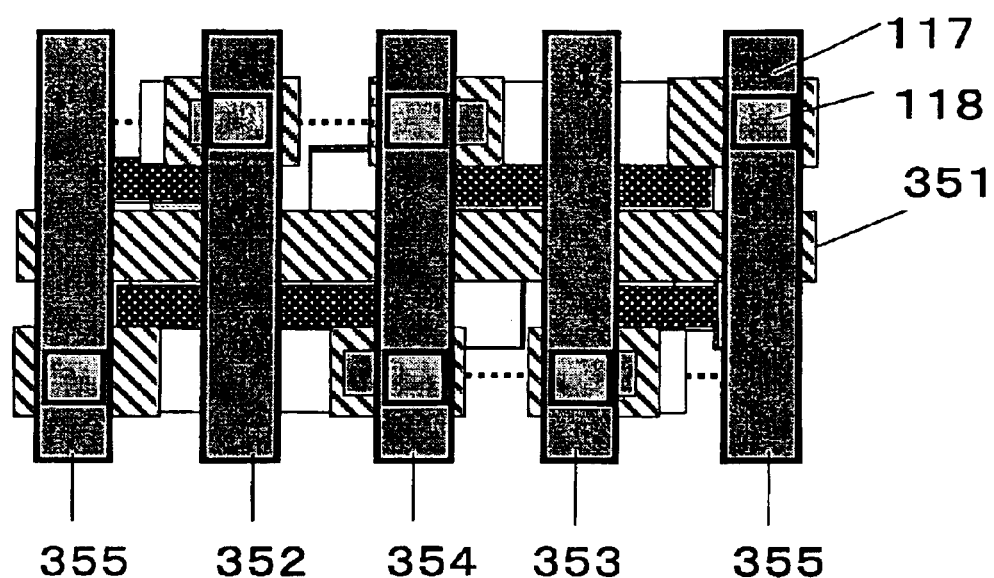
FIG. 27 is a drawing mainly showing a third-layer interconnection and a via section of connecting the third-layer interconnection to a layer lower than that in a layout example of a conventional third layer bit line type horizontal memory cell.

Incidentally, since the VSS power supply interconnection 204 exists in an interconnection layer different from that of the bit lines 114, 115 in this embodiment, such problems shown in the conventional example in FIG. 27 in which the word line is arranged in a lower layer of the bit line that an increase in a parasitic load capacitance of the bit lines 352, 353 in order that the VSS power supply interconnection 355 and the bit lines 352, 353 exist in the same layer and run in parallel to each other, and a yield drop caused by a short circuit failure due to particles between the VSS power supply interconnection 355 and the bit lines 352, 353 may not arise, either. Similarly, this problem may not arise in a third and a fourth embodiments mentioned below.

Second Embodiment

A second embodiment will be described using the drawings. A semiconductor memory device according to this embodiment represents a CMOS SRAM comprising a horizontal memory cell of a third layer bit line type.

Figure 23:
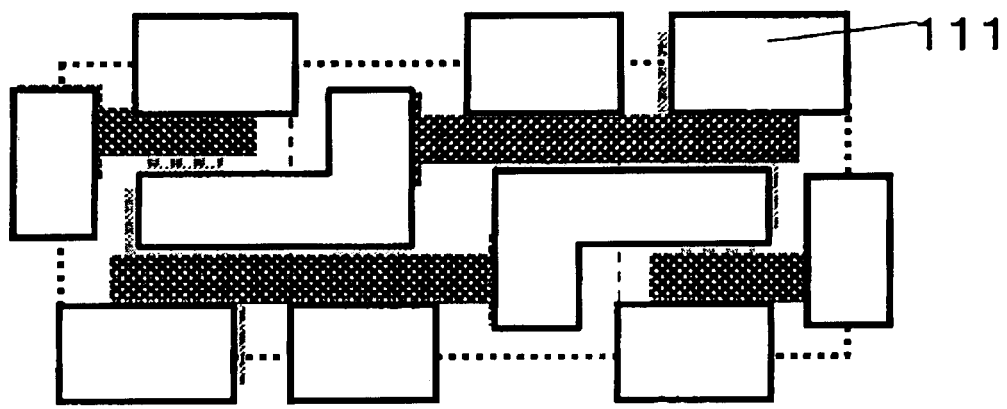
FIG. 23 is a drawing mainly showing a first-layer interconnection in a layout example of a conventional horizontal memory cell.
Figure 24:
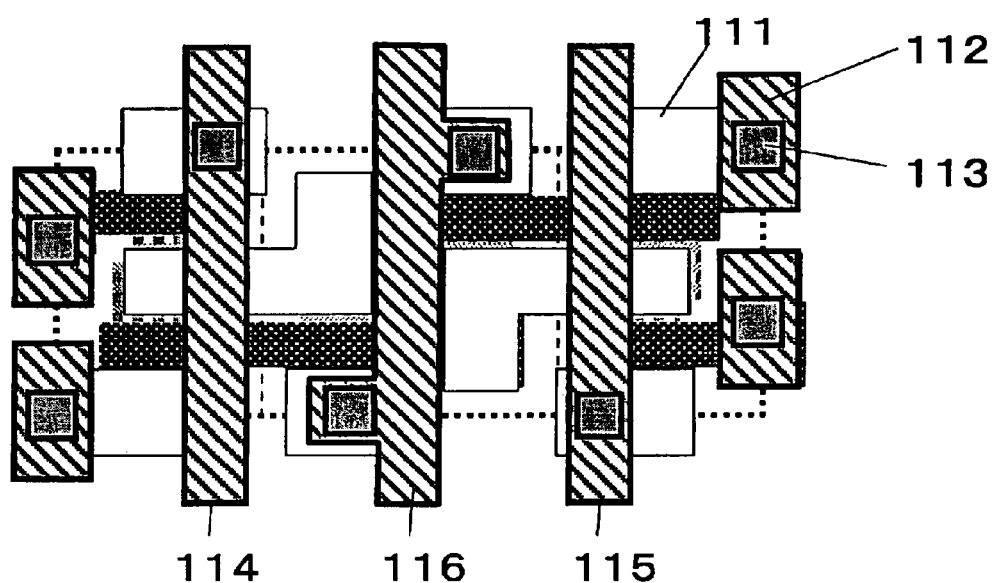
FIG. 24 is a drawing mainly showing a second-layer interconnection and a via section of connecting the second-layer interconnection to a layer lower than that in a layout example of a conventional second layer bit line type horizontal memory cell.

A layout of a lower layer section of the horizontal memory cell in this embodiment and a layout of a first-layer interconnection upper than that are similar to those of the second layer bit line type of FIGS. 21 and 23; an arrangement of the memory cell is also arranged in flip as shown in FIG. 22, and a circuit diagram of the memory cell is shown in FIG. 28.

Figure 11:
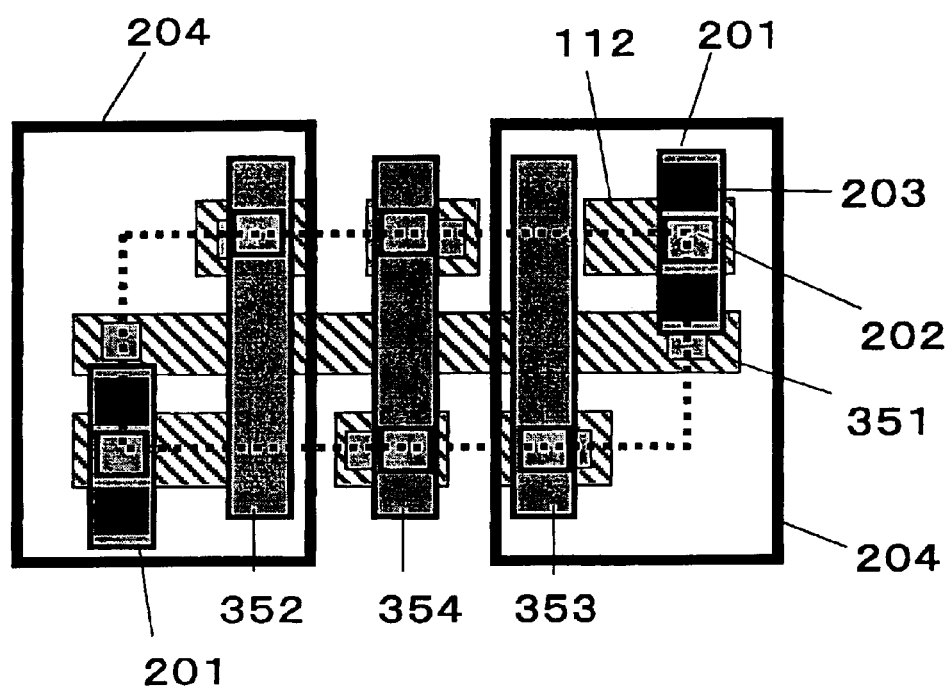
FIG. 11 is a drawing showing a memory cell layout illustrating a second-layer interconnection and an interconnection upper than that concerning a second embodiment according to the present invention.

An example of an interconnection layout equal to or upper than a second layer in this embodiment is shown in FIG. 11. The word line 351 is formed with the second-layer interconnection 112 as shown in FIG. 11, the positive/negative bit lines 352, 353, and the VDD power supply interconnection 354 are formed with a third-layer interconnection, and the VSS power supply interconnection 204 is formed with a fourth-layer interconnection. In the conventional third layer bit line type shown in FIG. 27, the VDD power supply interconnection 354, the VSS power supply interconnection 355, and the positive/negative bit lines 352, 353, each formed with the third-layer interconnection, have run in parallel over a long distance, there has been a possibility of an increase in the parasitic load capacitance of the bit lines 352, 353 with the progress in microfabrication, and a yield drop due to particles has been apt to be caused. Therefore, in this embodiment, the VSS power supply interconnection of the third layer which runs in parallel to the bit lines 352, 353 comprises only the island-shaped VSS node 201 for connection for passing the power supply interconnection from the upper layer to the lower layer as shown in FIG. 11, and the VSS power supply interconnection 204 is provided on the fourth layer upper than that. Since a parallel run length of the VSS power supply interconnection running in parallel to the bit lines 352, 353 becomes short in length, a bit line capacitance is reduced, and it becomes stronger against particles caused by the fabrication process, thereby increasing a yield.

Here, in order to form the VSS power supply interconnection 204 with the fourth-layer interconnection, the via section 203 of connecting the third layer to the fourth layer becomes also required. With respect to a concern that a yield drop caused by an increase in the number of the layers of the via section required to compose the logics, a plurality of via sections 203 are provided per connecting area in FIG. 11 similar to the first embodiment. That only the VSS power supply interconnection 204 exists in the fourth-layer interconnection, but the VDD power supply interconnection does not exist therein, and the VSS power supply interconnection 204 is extended in a parallel direction with respect to the boundary line between the wells so as to cover the bit lines 352, 353 have an effect similar to that described in the first embodiment.

Further, as described also in the first embodiment, the VDD power supply interconnection 205 is further arranged in the fourth layer (refer to FIGS. 4 and 7), and the VDD power supply interconnection 354 of the third layer is backed, so that the VDD power supply can also be reinforced.

Further, as described also in the first embodiment, although a pattern of the VSS power supply interconnection 204 of the fourth layer may be formed into a complete plate shape, it may be suitable for the latest copper damascene interconnection to be formed into a line-and-space shape or a mesh shape.

Further, as described also in the first embodiment, as shown in FIG. 11, the VSS power supply interconnection 204 of the fourth layer extended in a vertical direction, and the VDD power supply interconnection 354 of the third layer are horizontally interconnected to an interconnection of the second layer which is the same layer as that of the word line 351 in the substrate contact cell section to make the VDD power supply and the VSS power supply into a mesh structure, so that the power supply can also be reinforced.

Further, as described also in the first embodiment, the film thickness of the interconnection of the fourth layer is made thicker, so that the sheet resistance value of the VSS power supply interconnection 204 decreases, and the parasitic resistance is reduced, and thereby the supply capacity of the power supply can also be reinforced.

Further, since a probability of collectively becoming a failure in a bit line direction because the bit lines 352, 353 are short-circuited to VSS decreases by using the memory cell in this embodiment, the need of mounting the column redundancy repair circuit is reduced. The redundant circuit and the spare memory cell mounted thereon are used only for row redundancy, so that an increase in an area is avoided by means of mounting the column redundancy repair circuit to reduce an area, and thereby the memory block with high performance can be achieved.

Incidentally, in a case of this embodiment, since the VSS power supply interconnection 204 exists in an interconnection layer different from that of the word line 351, such problems shown in the conventional example in FIG. 25 in which the word line is arranged in an upper layer of the bit line that an increase in a parasitic load capacitance of the word line 119 in order that the VSS power supply interconnection 120 and the word line 119 may exist in the same layer and run in parallel to each other over a long distance, and a yield drop caused by a short circuit failure due to particles between the VSS power supply interconnection 120 and the word line 119 may not arise, either.

Third Embodiment

A third embodiment will be described using the drawings.

In the example shown by the first and the second embodiments, the layout of the memory cell ends up to the interconnection of the fourth layer. However, when an LSI with further multilayered interconnections, or very high speed of operation is required even if there exist some yield drop concerns, a memory cell corresponding to a five-layer interconnection can be configured based on an idea described in the first and the second embodiment.

Also in this embodiment, a layout of a lower layer section of the horizontal memory cell and a layout of a first-layer interconnection upper than that are similar to those of FIGS. 21 and 23; an arrangement of the memory cell is arranged in flip as shown in FIG. 22, and a circuit diagram of the memory cell is shown in FIG. 28. An example of an interconnection layout of a second layer, a third layer, a fourth layer, and a fifth layer in this embodiment is shown in FIGS. 12, 13, 14, and 15. In FIGS. 12 to 15, reference numeral 401 represents an island-shaped node for positive bit line connection of the second-layer interconnection; 402, an island-shaped node for negative bit line connection of the second-layer interconnection; 403, a positive bit line of the third-layer interconnection; 404, a negative bit line of the third-layer interconnection; 405, a via section of connecting the second layer to the third-layer interconnection; 406, an island-shaped VSS node of the third-layer interconnection; 412, a via section for connection which connects a word line 419 of the fourth-layer interconnection to an island-shaped pattern of the third-layer interconnection; 413, a VSS power supply interconnection of the fifth-layer interconnection; 414, a via section for connection between a VSS power supply interconnection 413 of the fifth layer and an island-shaped VSS node 418 of the fourth layer; 415, a cell boundary frame for 1 bit of the memory cell; and 416, a via section for VSS connection which connects the VSS node 418 of the fourth-layer interconnection to the VSS node 406 of the third-layer interconnection.

Figure 12:
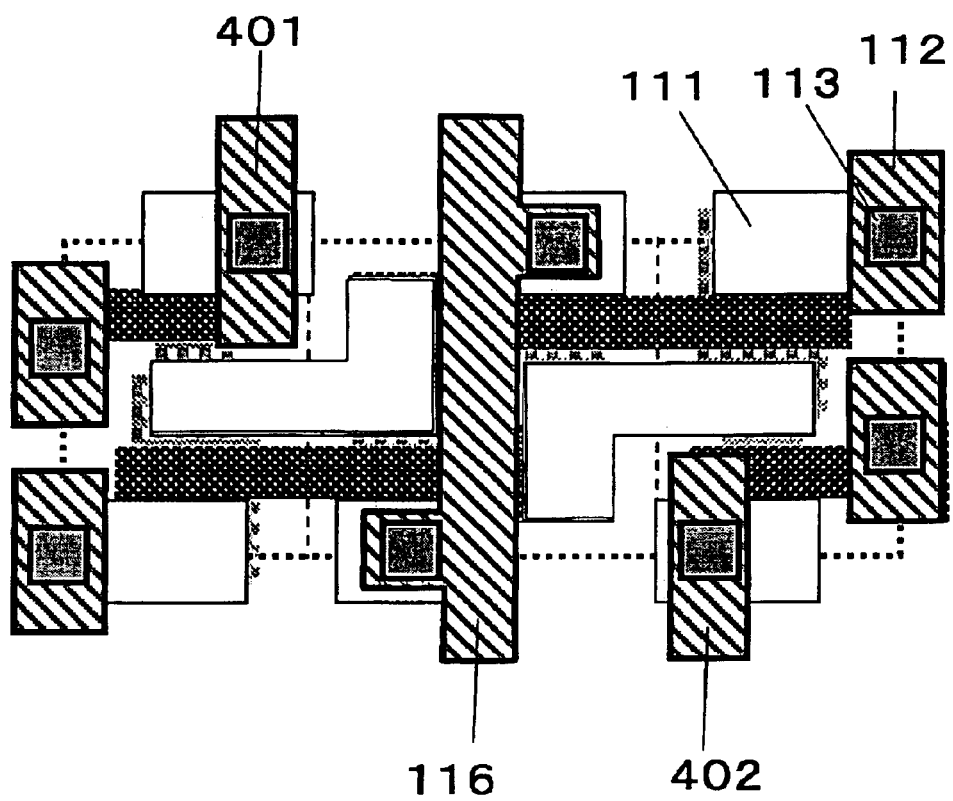
FIG. 12 is a drawing mainly showing a second-layer interconnection and a via section of connecting the second-layer interconnection to a layer lower than that in a layout example of a memory cell concerning a third embodiment according to the present invention.
Figure 13:
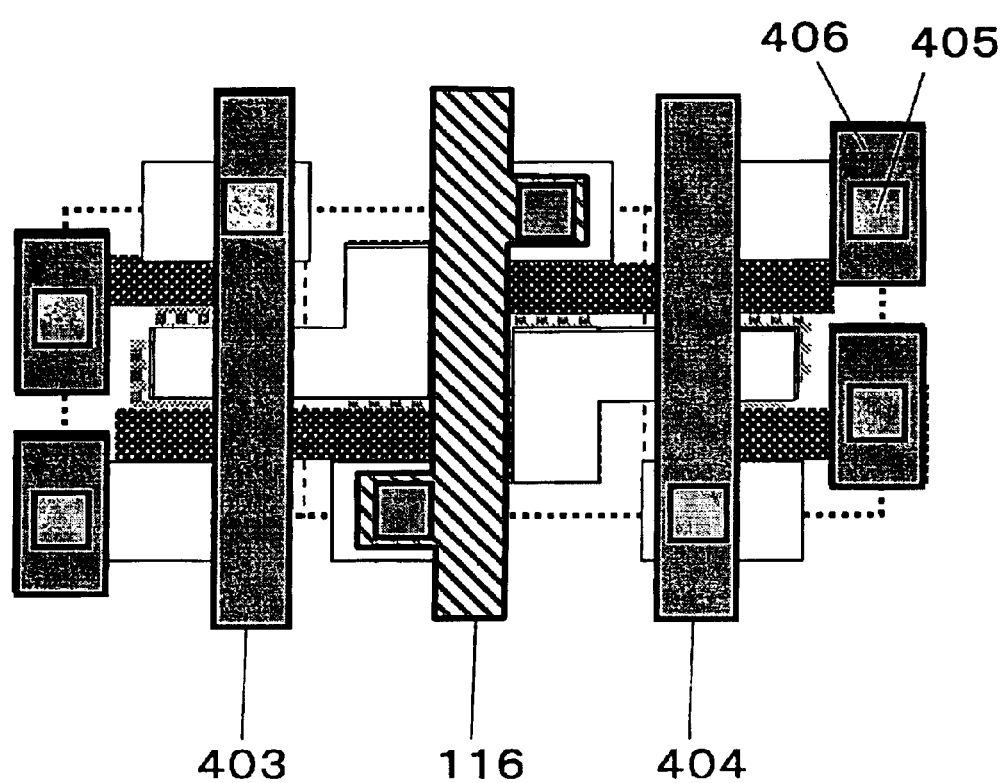
FIG. 13 is a drawing mainly showing a third-layer interconnection and a via section of connecting the third-layer interconnection to a layer lower than that in a layout example of a memory cell concerning the third embodiment.

Although the VDD power supply interconnection has been arranged between the positive/negative bit lines with the same metal interconnection to also serve as a shield in the first embodiment, in this embodiment, the VDD power supply interconnection 116 is arranged on the second layer as shown in FIG. 12, and the positive/negative bit lines 403, 404 are arranged on the third layer as shown in FIG. 13. Thereby, although a shield layer between the positive/negative bit lines 403, 404 within the cell of its own is eliminated, an absolute value of a bit line capacitance itself is reduced. If a width of the VDD power supply interconnection is W, and a spacing between the VDD power supply interconnection and the bit line is d, when the VDD power supply interconnection between the bit lines 403 and 404 does not exist in the same layer as those, a capacitance between the positive/negative bit lines becomes $C \propto \epsilon \div (W+2*d)$, but when the VDD power supply interconnection exists in the same layer as those, $C \propto \epsilon \div d$ is obtained. Although interference between the positive/negative bit lines arises without the shield layer, when a spacing distance is not so close and a coupling capacitance between the positive/negative bit lines is small, a transition time of the bit line becomes faster accordingly since the parasitic capacitance is small, and thereby, an access time can be made faster.

Figure 14:
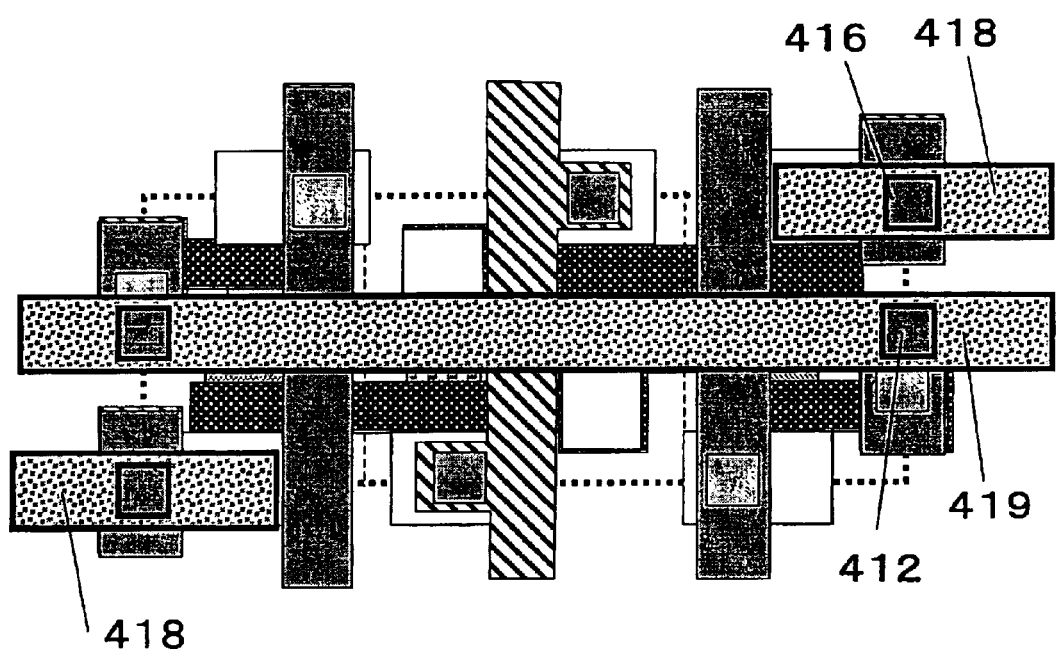
FIG. 14 is a drawing mainly showing a fourth-layer interconnection and a via section of connecting the fourth-layer interconnection to a layer lower than that in a layout example of a memory cell concerning the third embodiment.
Figure 15:
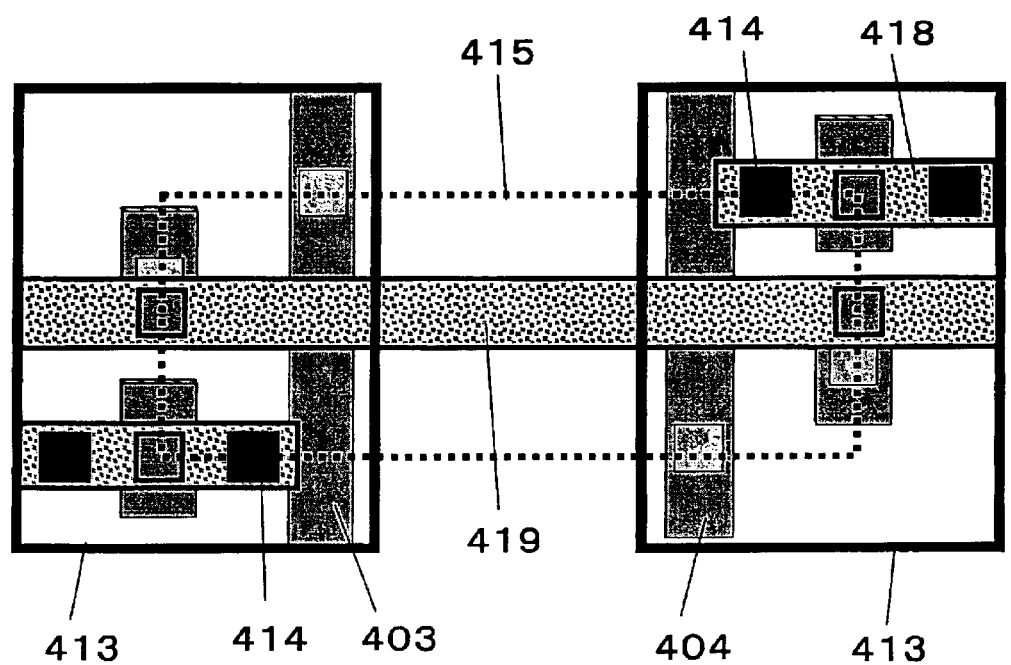
FIG. 15 is a drawing mainly showing a fifth-layer interconnection and a via section of connecting the fifth-layer interconnection to a layer lower than that in a layout example of a memory cell concerning the third embodiment.

The word line 419 is then arranged on the fourth layer as shown in FIG. 14, only the VSS node 418 with the island-shaped pattern for connection exists therein as the VSS power supply interconnection of the fourth layer. The VSS power supply interconnection 413 is arranged on the fifth layer as shown in FIG. 15.

Here, in order to form the VSS power supply interconnection 413 with the fifth-layer interconnection, the via section 414 which connects the fourth layer to the fifth layer is also required, and a yield drop caused by an increase in the number of the layers of via section is suppressed by providing a plurality of via sections 414 per connecting area That only the VSS power supply interconnection 413 exists in the fifth-layer interconnection, but the VDD power supply interconnection does not exist therein, and the VSS power supply interconnection 413 is extended in a parallel direction with respect to the boundary line between the wells so as to cover the bit lines 403, 404, although interconnection layers thereof are not the same, have an effect similar to that described in the first embodiment.

Further, although interconnection layers are not the same, as described also in the first embodiment, the VDD power supply interconnection 205 is further arranged in the fifth layer which is the same layer as that of the VSS power supply interconnection 413 (refer to FIGS. 4 and 7), and the VDD power supply interconnection 116 of the second layer is backed, so that the VDD power supply can also be reinforced.

Further, although interconnection layers are not the same, as described also in the first embodiment, although a pattern of the VSS power supply interconnection 413 of the fifth layer may be formed into a complete plate shape, it may be suitable for the latest copper damascene interconnection to be formed into a line-and-space shape or a mesh shape.

Further, although interconnection layers are not the same, as described also in the first embodiment, the word line 419 is bent as shown in FIG. 8, and the interconnection width is further made wider to make into a bent type word line having a wider width as shown in FIG. 9, so that there can be obtained a similar effect.

Further, as for a signal line, a film thickness of the fourth layer in which only the word line 419 exists is made thicker than a film thickness of the interconnection equal to or lower than the third layer, and a film thickness of the fifth layer in which only the VSS power supply interconnection 413 exists is made thicker, so that it becomes possible to further suppress a resistance value of the word line 419 or the VSS power supply interconnection 413, and thereby, an interconnection delay can be suppressed and a supply capacity of the power supply can be reinforced.

Fourth Embodiment

A fourth embodiment will be described using the drawings.

Also in this embodiment, a layout of a lower layer section of the horizontal memory cell and a layout of a first-layer interconnection upper than that are similar to those of FIGS. 21 and 23; an arrangement of the memory cell is arranged in flip as shown in FIG. 22, and a circuit diagram of the memory cell is shown in FIG. 28. An example of an interconnection layout of a second layer, a third layer, a fourth layer, and a fifth layer in this embodiment is shown in FIGS. 16, 17, 18, and 19. In FIGS. 16 to 19, reference numeral 407 represents a positive bit line of a second-layer interconnection; 408, a negative bit line of the second-layer interconnection; 409, an island-shaped VDD node of the second-layer interconnection; 410, a VDD interconnection of a third-layer interconnection; 411, a bent type word line of a fourth-layer interconnection; and 417, an island-shaped VSS node of the fourth-layer interconnection.

Figure 16:
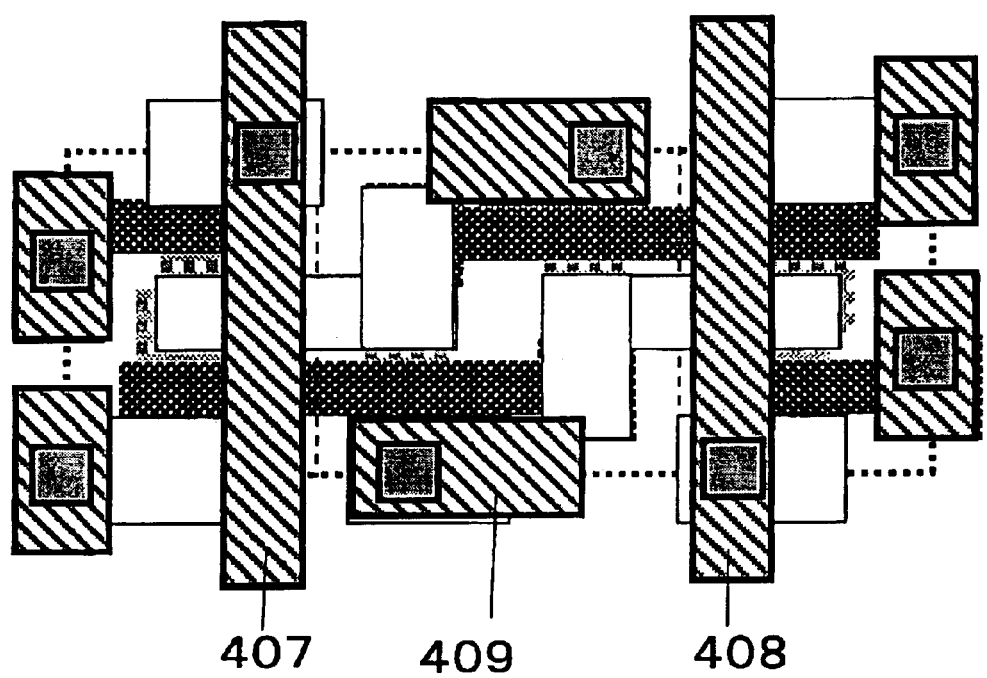
FIG. 16 is a drawing mainly showing a second-layer interconnection and a via section of connecting the second-layer interconnection to a layer lower than that in a layout example of a memory cell concerning a fourth embodiment according to the present invention.
Figure 17:
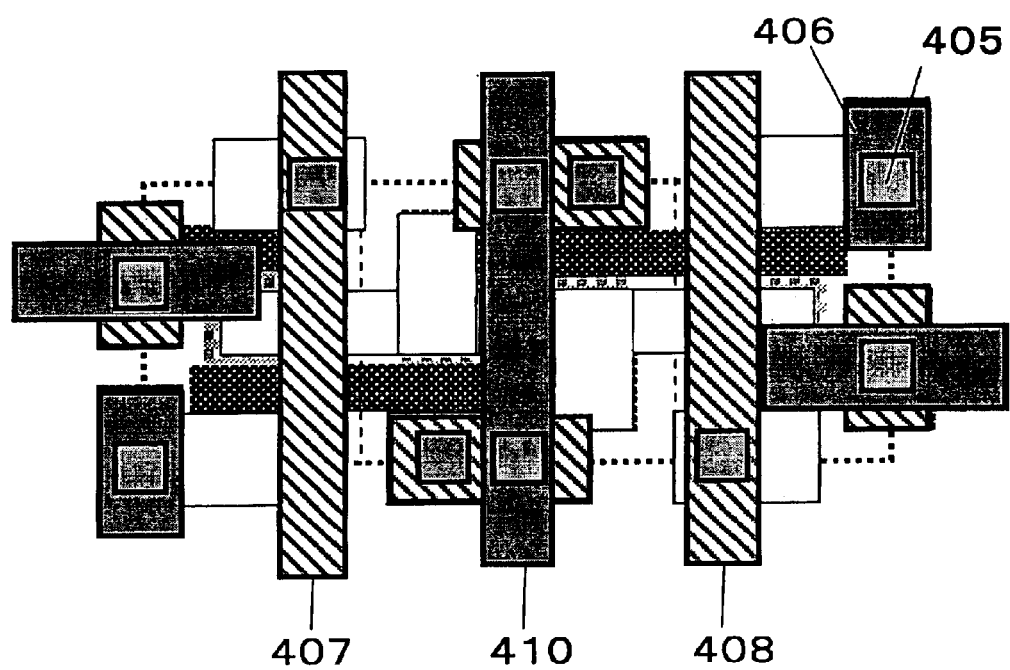
FIG. 17 is a drawing mainly showing a third-layer interconnection and a via section of connecting the third-layer interconnection to a layer lower than that in a layout example of a memory cell concerning the fourth embodiment.

This embodiment has a memory cell configuration corresponding to a five-layer interconnection similar to the third embodiment. Although the VDD power supply interconnection has been arranged on the second layer and the bit line has been arranged on the third layer in the third embodiment, in this embodiment, the bit lines 407, 408 are arranged on the second layer, and the VDD power supply interconnection 410 is arranged on the third layer as shown in FIGS. 16 and 17. Thus, a shield between the positive/negative bit lines is removed similar to the third embodiment, so that a bit line capacitance can be reduced. However, in order to form the VDD power supply interconnection 410 with the third-layer interconnection, the VDD node 409 with the island-shaped pattern exists as the second-layer interconnection in this fourth embodiment, so that an effect that the bit lines 407, 408, and the VDD power supply interconnection 410 are arranged on different interconnections will slightly be reduced. As for a layout structure where the bit lines 407, 408 are arranged on the second layer like this fourth embodiment, as via sections of the bit lines 407, 408 are shallower than that of a layout structure where the bit line is arranged on the third layer there is a possibility that the bit line capacitance will be reduced.

Interconnection performance may change according to various situations, such as width and spacing of each layout, cross section structure and a dielectric constant of a constituent material, or the like.

Figure 18:
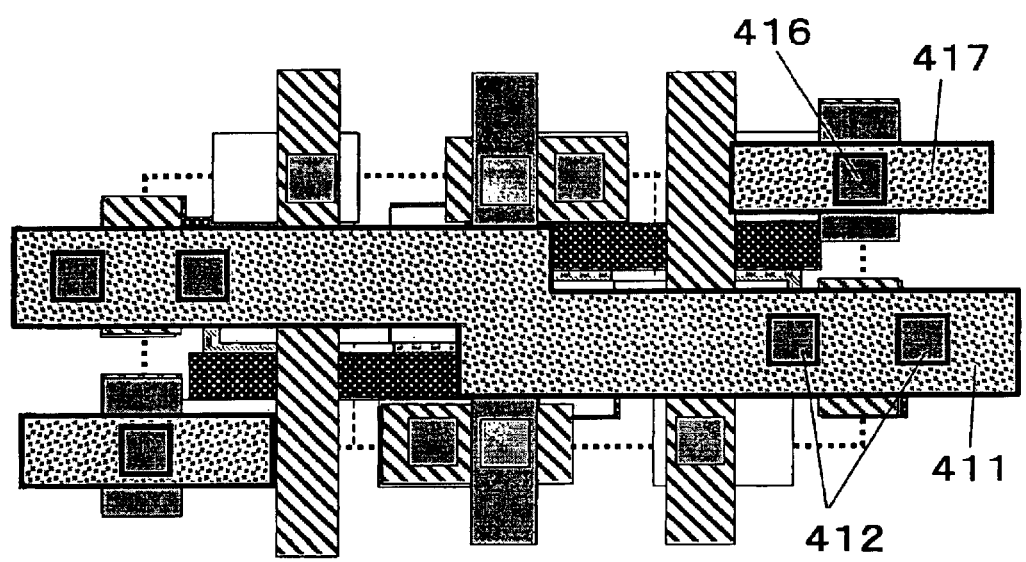
FIG. 18 is a drawing mainly showing a fourth-layer interconnection and a via section of connecting the fourth-layer interconnection to a layer lower than that in a layout example of a memory cell concerning the fourth embodiment.
Figure 19:
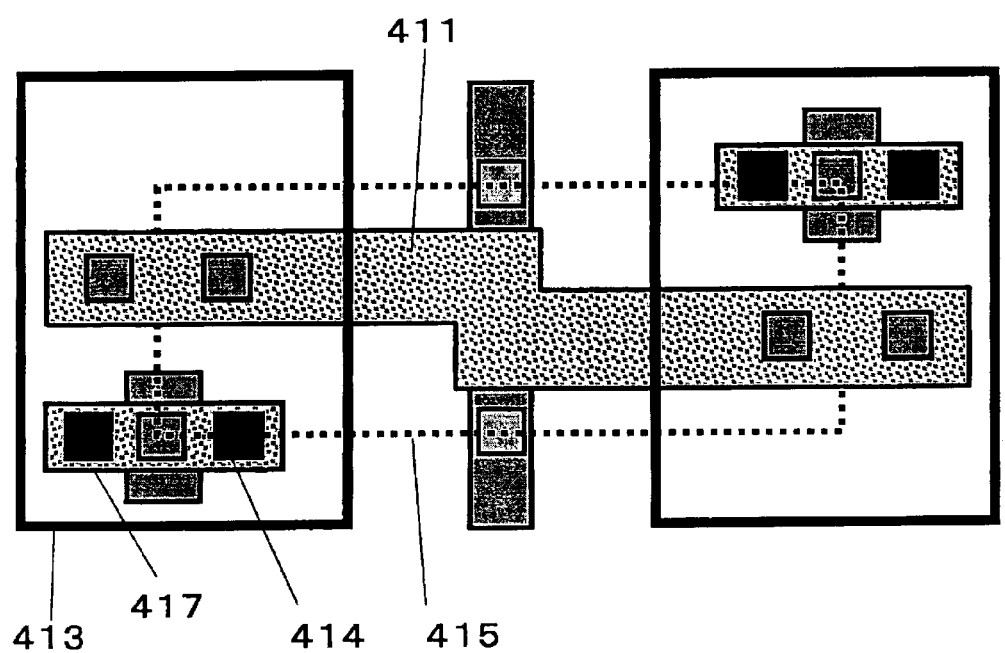
FIG. 19 is a drawing mainly showing a firth-layer interconnection and a via section of connecting the firth-layer interconnection to a layer lower than that in a layout example of a memory cell concerning the fourth embodiment.
Figure 20:
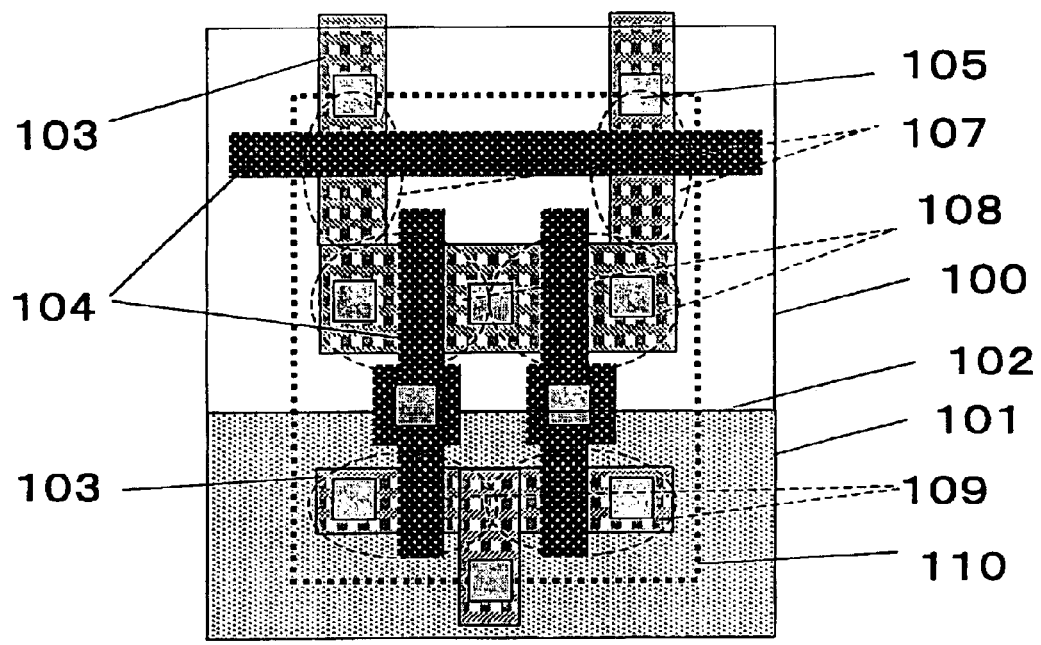
FIG. 20 is a drawing showing a layout example of a lower layer section of a conventional vertical memory cell.

Further, in FIG. 18 showing a layout of the fourth layer, the word line 411 is made wide and bent. Since a resistance value of the word line becomes large value as it is extended over a long distance within the memory block, it will have a problem in many cases. Similar to a case of the first embodiment, while making the spacing to the island-shaped VSS node 417 of the fourth layer wider and reducing a capacitance by means of bending, a word line width is made wider to thereby decrease the word line resistance.

Further, a plurality of via sections 412 of connecting the word line 411 to the lower pattern are provided per connecting area. Thus, concerns about yield drop by means of multilayered interconnection and use of a large number of layers in the via section will be relieved.

Further, as for a signal line, a film thickness of the fourth layer in which only the word line 411 exists is made thicker than a film thickness of the interconnection equal to or lower than the third layer, and a film thickness of the fifth layer in which only the VSS power supply interconnection 413 exists is made thicker, so that it becomes possible to further suppress the resistance value of the word line 411 or the VSS power supply interconnection 413.

In addition, as have been described in the third embodiment, although interconnection layers are not the same, modifications similar to the first embodiment can be made.

Incidentally, in order that there may be no parallel run over a long distance between the word line (419, 411) and the VSS power supply interconnection (413) in the third embodiment and the fourth embodiment, it is needless to say that the parasitic capacitance of the word line is reduced, thereby an improvement in speed can be achieved, and a probability that the word line and the VSS power supply interconnection fall into short circuit failure due to particles is reduced, and an effect of increasing a yield can be obtained.

What is claimed is:

1. In a semiconductor memory device comprising a plurality of CMOS SRAM cells, being arranged on a semiconductor substrate in a matrix shape, each comprising a pair of access transistors, a pair of drive transistors, and a pair of load transistors, each region being a cell region with an elongated shape in a row direction, wherein three well regions are formed side by side in a row direction so that a second conductivity type well region may be disposed between two first conductivity type well regions on said semiconductor substrate, and wherein one of said access transistors and one of said drive transistors are formed in each of two said first conductivity type well regions within said cell region, and a pair of said load transistors is formed in said second conductivity type well region; and comprising a plurality of interconnection layers over transistors which configure said CMOS SRAM cell; the semiconductor memory device, comprising:

a plurality of paired bit lines, formed of one of said plurality of interconnection layers, each being extended in a column direction to be connected to said CMOS SRAM cell in the same column, and arranged in parallel in a row direction;

a plurality of high potential side power supply interconnections, formed of the same interconnection layer as that of said bit line, and each being arranged between said paired bit lines to be connected to said CMOS SRAM cell in the same column;

a plurality of word lines, formed of said interconnection layer upper than that of said bit line by one layer, each being extended in a row direction to be connected to said CMOS SRAM cell in the same row, and arranged in parallel in a column direction; and a low potential side power supply interconnection, formed of said interconnection layer upper than that of said word line by one layer, and connected to said CMOS SRAM cell.

2. A semiconductor memory device according to claim 1, wherein a width in a row direction of each region of said CMOS SRAM cell is not two times smaller than a width in a column direction thereof.

3. A semiconductor memory device according to claim 1, wherein said low potential side power supply interconnection is connected to said CMOS SRAM cell via said island-shaped pattern for said low potential side power supply formed of said interconnection layer lower than that of said low potential side power supply interconnection by one layer, and a connection between said low potential side power supply interconnection and said island-shaped pattern for said low potential side power supply is made by arranging a plurality of via sections per said island-shaped pattern for said low potential side power supply.

4. A semiconductor memory device according to claim 1, wherein said low potential side power supply interconnection is connected to said CMOS SRAM cell via said island-shaped pattern for said low potential side power supply formed of the same interconnection layer as that of the word line, and in order to make a spacing between said island-shaped pattern for said low potential side power supply and said word line large in width, or in order to make a line width of said word line wide, said word line is bent.

5. A semiconductor memory device according to claim 1, wherein a plurality of low potential side power supply interconnections are arranged in parallel in a row direction, and are arranged so as to cover the bit line.

6. A semiconductor memory device according to claim 1, wherein there is provided a high potential side power supply reinforcement interconnection which is formed of the same interconnection as that of the low potential side power supply interconnection, and is connected to the high potential side power supply interconnection.

7. A semiconductor memory device according to claim 6, wherein a connection between the high potential side power supply reinforcement interconnection and the high potential side power supply interconnection is made in a substrate contact cell region for ensuring a substrate potential of a transistor which configures the CMOS SRAM cell.

8. A semiconductor memory device according to claim 1, wherein the semiconductor memory device provides a power supply reinforcement interconnection which is formed of the same interconnection layer as that of the word line within a substrate contact cell region for ensuring a substrate potential of a transistor which configures the CMOS SRAM cell, and is extended in a row direction; and connects said power supply reinforcement interconnection to said high potential side power supply interconnection or said low potential side power supply interconnection in an intersection point to the high potential side power supply interconnection or the low potential side power supply interconnection.

9. A semiconductor memory device according to claim 1, wherein the low potential side power supply interconnection is formed into a mesh shape.

10. A semiconductor memory device according to claim 1, wherein a film thickness of an interconnection layer forming the low potential side power supply interconnection is made thicker than a film thickness of an interconnection lower than said low potential side power supply interconnection.

11. A semiconductor memory device according to claim 1, wherein the semiconductor memory device does not have a row redundant circuit but has only a column redundant circuit as a redundant circuit.

12. In a semiconductor memory device comprising a plurality of CMOS SRAM cells, being arranged on a semiconductor substrate in a matrix shape, each comprising a pair of access transistors, a pair of drive transistors, and a pair of load transistors, each region being a cell region with an elongated shape in a row direction, wherein three well regions are formed side by side in a row direction so that a second conductivity type well region may be disposed between two first conductivity type well regions on said semiconductor substrate, and wherein one of said access transistors and one of said drive transistors are formed in each of two said first conductivity type well regions within said cell region, and a pair of said load transistors is formed in said second conductivity type well region; and comprising a plurality of interconnection layers over said transistors which configure said CMOS SRAM cell; the semiconductor memory device, comprising:

a plurality of word lines, formed of one of said plurality of interconnection layers, each being extended in a row direction to be connected to said CMOS SRAM cell in the same row, and arranged in parallel in a column direction;

a plurality of paired bit lines, formed of said interconnection layer upper than that of said word line by one layer, and each being extended in a column direction to be connected to said CMOS SRAM cell in the same column, and arranged in parallel in a row direction;

a plurality of high potential side power supply interconnections, formed of the same interconnection layer as that of said bit line, and each being arranged between said paired bit lines to be connected to said CMOS SRAM cell in the same column; and a low potential side power supply interconnection, formed of said interconnection layer upper than that of said bit line by one layer, and connected to said CMOS SRAM cell.

13. A semiconductor memory device according to claim 12, wherein a width in a row direction of each region of said CMOS SRAM cell is not two times smaller than a width in a column direction thereof.

14. A semiconductor memory device according to claim 12, wherein said low potential side power supply interconnection is connected to said CMOS SRAM cell via said island-shaped pattern for said low potential side power supply formed of said interconnection layer lower than that of said low potential side power supply interconnection by one layer, and a connection between said low potential side power supply interconnection and said island-shaped pattern for said low potential side power supply is made by arranging a plurality of via sections per said island-shaped pattern for said low potential side power supply.

15. A semiconductor memory device according to claim 12, wherein said low potential side power supply interconnection is connected to said CMOS SRAM cell via said island-shaped pattern for said low potential side power supply formed of the same interconnection layer as that of the word line, and in order to make a spacing between said island-shaped pattern for said low potential side power supply and said word line large in width, or in order to make a line width of said word line wide, said word line is bent.

16. A semiconductor memory device according to claim 12, wherein a plurality of low potential side power supply interconnections are arranged in parallel in a row direction, and are arranged so as to cover the bit line.

17. A semiconductor memory device according to claim 12, wherein there is provided a high potential side power supply reinforcement interconnection which is formed of the same interconnection as that of the low potential side power supply interconnection, and is connected to the high potential side power supply interconnection.

18. A semiconductor memory device according to claim 17, wherein a connection between the high potential side power supply reinforcement interconnection and the high potential side power supply interconnection is made in a substrate contact cell region for ensuring a substrate potential of a transistor which configures the CMOS SRAM cell.

19. A semiconductor memory device according to claim 12, wherein the semiconductor memory device provides a power supply reinforcement interconnection which is formed of the same interconnection layer as that of the word line within a substrate contact cell region for ensuring a substrate potential of a transistor which configures the CMOS SRAM cell, and is extended in a row direction; and connects said power supply reinforcement interconnection to said high potential side power supply interconnection or said low potential side power supply interconnection in an intersection point to the high potential side power supply interconnection or the low potential side power supply interconnection.

20. A semiconductor memory device according to claim 12, wherein the low potential side power supply interconnection is formed into a mesh shape.

21. A semiconductor memory device according to claim 12, wherein a film thickness of an interconnection layer forming the low potential side power supply interconnection is made thicker than a film thickness of an interconnection lower than said low potential side power supply interconnection.

22. A semiconductor memory device according to claim 12, wherein the semiconductor memory device does not have a column redundant circuit but has only a row redundant circuit as a redundant circuit.

23. In a semiconductor memory device comprising a plurality of CMOS SRAM cells, being arranged on a semiconductor substrate in a matrix shape, each comprising a pair of access transistors, a pair of drive transistors, and a pair of load transistors, each region being a cell region with an elongated shape in a row direction, wherein three well regions are formed side by side in a row direction so that a second conductivity type well region may be disposed between two first conductivity type well regions on said semiconductor substrate, and wherein one of said access transistors and one of said drive transistors are formed in each of two said first conductivity type well regions within said cell region, and a pair of said load transistors is formed in said second conductivity type well region; and comprising a plurality of interconnection layers over transistors which configure said CMOS SRAM cell; the semiconductor memory device, comprising:

a plurality of high potential side power supply interconnections, formed of one of said plurality of interconnection layers, each being extended in a column direction to be connected to said CMOS SRAM cell in the same column, and arranged in parallel in a row direction;

a plurality of paired bit lines, formed of said interconnection layer upper than that of said high potential side power supply interconnection by one layer, each being extended in a column direction to be connected to said CMOS SRAM cell in the same column, and arranged in parallel in a row direction;

a plurality of word lines, formed of said interconnection layer upper than that of said bit line by one layer, each being extended in a row direction to be connected to said CMOS SRAM cell in the same row, and arranged in parallel in a column direction; and a low potential side power supply interconnection, formed of said interconnection layer upper than that of said word line by one layer, and connected to said CMOS SRAM cell.

24. A semiconductor memory device according to claim 23, wherein a width in a row direction of each region of said CMOS SRAM cell is not two times smaller than a width in a column direction thereof.

25. A semiconductor memory device according to claim 23, wherein said word line is connected to said access transistor of said CMOS SRAM cell via an island-shaped pattern formed of said interconnection layer lower than that of said word line by one layer, and a connection between said word line and said island-shaped pattern is made by arranging a plurality of via sections per said island-shaped pattern.

26. A semiconductor memory device according to claim 23, wherein said low potential side power supply interconnection is connected to said CMOS SRAM cell via said island-shaped pattern for said low potential side power supply formed of said interconnection layer lower than that of said low potential side power supply interconnection by one layer, and a connection between said low potential side power supply interconnection and said island-shaped pattern for said low potential side power supply is made by arranging a plurality of via sections per said island-shaped pattern for said low potential side power supply.

27. A semiconductor memory device according to claim 23, wherein said low potential side power supply interconnection is connected to said CMOS SRAM cell via said island-shaped pattern for said low potential side power supply formed of the same interconnection layer as that of said word line, and in order to make a spacing between said island-shaped pattern for said low potential side power supply and said word line large in width, or in order to make a line width of said word line wide, said word line is bent.

28. A semiconductor memory device according to claim 23, wherein a plurality of low potential side power supply interconnections are arranged in parallel in a row direction, and are arranged so as to cover the bit line.

29. A semiconductor memory device according to claim 23, wherein there is provided a high potential side power supply reinforcement interconnection which is formed of the same interconnection as that of the low potential side power supply interconnection, and is connected to the high potential side power supply interconnection.

30. A semiconductor memory device according to claim 29, wherein a connection between the high potential side power supply reinforcement interconnection and the high potential side power supply interconnection is made in a substrate contact cell region for ensuring a substrate potential of a transistor which configures the CMOS SRAM cell.

31. A semiconductor memory device according to claim 23, wherein the semiconductor memory device provides a power supply reinforcement interconnection which is formed of the same interconnection layer as that of the word line within a substrate contact cell region for ensuring a substrate potential of a transistor which configures the CMOS SRAM cell, and is extended in a row direction; and connects said power supply reinforcement interconnection to said high potential side power supply interconnection or said low potential side power supply interconnection in an intersection point to the high potential side power supply interconnection or the low potential side power supply interconnection.

32. A semiconductor memory device according to claim 23, wherein the low potential side power supply interconnection is formed into a mesh shape.

33. A semiconductor memory device according to claim 23, wherein a film thickness of an interconnection layer forming the word line is made thicker than a film thickness of an interconnection layer lower than the word line.

34. A semiconductor memory device according to claim 23, wherein a film thickness of an interconnection layer forming the low potential side power supply interconnection is made thicker than a film thickness of an interconnection lower than said low potential side power supply interconnection.

35. In semiconductor memory device comprising a plurality of CMOS SRAM cells, being arranged on a semiconductor substrate in a matrix shape, each comprising a pair of access transistors, a pair of drive transistors, and a pair of load transistors, each region being a cell region with an elongated shape in a row direction, wherein three well regions are formed side by side in a row direction so that a second conductivity type well region may be disposed between two first conductivity type well regions on said semiconductor substrate, and wherein one of said access transistors and one of said drive transistors are formed in each of two said first conductivity type well regions within said cell region, and a pair of said load transistors is formed in said second conductivity type well region; and comprising a plurality of interconnection layers over transistors which configure said CMOS SRAM cell; the semiconductor memory device, comprising:

a plurality of paired bit lines, formed of one of said plurality of interconnection layers, each being extended in a column direction to be connected to said CMOS SRAM cell in the same column, and arranged in parallel in a row direction;

a plurality of high potential side power supply interconnections, formed of said interconnection layer upper than that of said bit line by one layer, each being extended in a column direction to be connected to said CMOS SRAM cell in the same column, and arranged in parallel in a row direction;

a plurality of word lines, formed of said interconnection layer upper than that of said high potential side power supply interconnection by one layer, each being extended in a row direction to be connected to said CMOS SRAM cell in the same row, and arranged in parallel in a column direction; and a low potential side power supply interconnection, formed of said interconnection layer upper than that of said word line by one layer, and connected to said CMOS SRAM cell.

36. A semiconductor memory device according to claim 35, wherein a width in a row direction of each region of said CMOS SRAM cell is not two times smaller than a width in a column direction thereof.

37. A semiconductor memory device according to claim 35, wherein said word line is connected to said access transistor of said CMOS SRAM cell via said island-shaped pattern formed of said interconnection layer lower than that of said word line by one layer, and a connection between said word line and said island-shaped pattern is made by arranging a plurality of via sections per said island-shaped pattern.

38. A semiconductor memory device according to claim 35, wherein said low potential side power supply interconnection is connected to said CMOS SRAM cell via said island-shaped pattern for said low potential side power supply formed of said interconnection layer lower than that of said low potential side power supply interconnection by one layer, and a connection between said low potential side power supply interconnection and said island-shaped pattern for said low potential side power supply is made by arranging a plurality of via sections per said island-shaped pattern for said low potential side power supply.

39. A semiconductor memory device according to claim 35, wherein said low potential side power supply interconnection is connected to said CMOS SRAM cell via said island-shaped pattern for said low potential side power supply formed of the same interconnection layer as that of said word line, and in order to make a spacing between said island-shaped pattern for said low potential side power supply and said word line large in width, or in order to make a line width of said word line wide, said word line is bent.

40. A semiconductor memory device according to claim 35, wherein a plurality of low potential side power supply interconnections are arranged in parallel in a row direction, and are arranged so as to cover the bit line.

41. A semiconductor memory device according to claim 35, wherein there is provided a high potential side power supply reinforcement interconnection which is formed of the same interconnection as that of the low potential side power supply interconnection, and is connected to the high potential side power supply interconnection.

42. A semiconductor memory device according to claim 41, wherein a connection between the high potential side power supply reinforcement interconnection and the high potential side power supply interconnection is made in a substrate contact cell region for ensuring a substrate potential of a transistor which configures the CMOS SRAM cell.

43. A semiconductor memory device according to claim 35, wherein the semiconductor memory device provides a power supply reinforcement interconnection which is formed of the same interconnection layer as that of the word line within a substrate contact cell region for ensuring a substrate potential of a transistor which configures the CMOS SRAM cell, and is extended in a row direction; and connects said power supply reinforcement interconnection to said high potential side power supply interconnection or said low potential side power supply interconnection in an intersection point to the high potential side power supply interconnection or the low potential side power supply interconnection.

44. A semiconductor memory device according to claim 35, wherein the low potential side power supply interconnection is formed into a mesh shape.

45. A semiconductor memory device according to claim 35, wherein a film thickness of an interconnection layer forming the word line is made thicker than a film thickness of an interconnection layer lower than the word line.

46. A semiconductor memory device according to claim 35, wherein a film thickness of an interconnection layer forming the low potential side power supply interconnection is made thicker than a film thickness of an interconnection lower than said low potential side power supply interconnection.

* * * * *